(12) United States Patent
Boettcher et al.

(10) Patent No.: US 8,659,451 B2
(45) Date of Patent: Feb. 25, 2014

(54) INDEXING COMPRESSED DATA

(75) Inventors: Stefan Boettcher, Paderborn (DE);
Alexander Bueltmann, Duisburg (DE);
Rita Hartel, Paderborn (DE)

(73) Assignee: Universitaet Paderborn, Paderborn (DE)

( * ) Notice: Subject to any disclaimer, the term of this patent is extended or adjusted under 35 U.S.C. 154(b) by 0 days.

(21) Appl. No.: 13/509,286

(22) PCT Filed: Dec. 18, 2009

(86) PCT No.: PCT/EP2009/067499
§ 371 (c)(1),
(2), (4) Date: May 11, 2012

(87) PCT Pub. No.: WO2011/057680
PCT Pub. Date: May 19, 2011

(65) Prior Publication Data
US 2012/0218130 A1    Aug. 30, 2012

(30) Foreign Application Priority Data

Nov. 13, 2009 (DE) .................. 10 2009 052 886
Nov. 23, 2009 (DE) .................. 10 2009 047 026

(51) Int. Cl.
*H03M 7/30* (2006.01)

(52) U.S. Cl.
USPC ............. 341/87; 382/244; 382/235; 382/240; 382/232; 715/234; 707/693; 707/774; 707/641; 707/736; 707/756; 375/240.16

(58) Field of Classification Search
USPC ............. 341/50–90; 382/244, 235, 240, 232; 715/234; 707/693, 774, 641, 736, 756; 375/240.16

See application file for complete search history.

(56) References Cited

U.S. PATENT DOCUMENTS

| 5,442,350 A | * | 8/1995 | Iyer et al. ................. 341/51 |
| 5,610,603 A | * | 3/1997 | Plambeck ................. 341/51 |
| 5,872,530 A | * | 2/1999 | Domyo et al. ............ 341/106 |

(Continued)

FOREIGN PATENT DOCUMENTS

WO    WO 2007/031380 A2    3/2007

OTHER PUBLICATIONS

P. Ferragina et al.: "Indexing Compressed Text", Journal of the ACM, vol. 52, No. 4, pp. 552-581 (Jul. 2005).

(Continued)

*Primary Examiner* — Lam T Mai
(74) *Attorney, Agent, or Firm* — Norman B. Thot

(57) ABSTRACT

A method to at least one of compress and decompress data includes providing a string (T) consisting of multiple given substrings. Identification symbols ($, $_1$, $_2$, $_3$) are assigned to the substrings of the string (T). The substrings of the string (T) are transferred by permutation into a permuted string (O(T), O*(T)). The permuted string (O(T),O*(T)) is sorted into a sorted permuted string (oSort(T), oSort*(T)) according to a given sorting criterion. The identification symbols ($, $_1$, $_2$, $_3$) are permuted and sorted together with the substrings of the sting (T) so that, in a partial inverse transformation step, characters of an Nth substring are sequentially determined within the permuted string (O(T),O*(T)) after determining a position (P) of an Nth identification symbol ($, $_1$, $_2$, $_3$) assigned to an Nth substring within the sorted permuted string (oSort(T),oSort*(T)) without reading characters of other substrings of the permuted string (O(T),O*(T)).

12 Claims, 11 Drawing Sheets

(56) References Cited

U.S. PATENT DOCUMENTS

| | | | |
|---|---|---|---|
| 5,883,588 A * | 3/1999 | Okamura | 341/5 |
| 5,999,949 A * | 12/1999 | Crandall | 341/51 |
| 6,670,897 B1 * | 12/2003 | Lin | 341/65 |
| 7,372,377 B2 * | 5/2008 | Mushano et al. | 341/59 |
| 8,059,013 B2 * | 11/2011 | Aono | 340/905 |

OTHER PUBLICATIONS

P. Ferragina et al.: "An experimental study of an opportunistic index", Proceedings Twelfth Annual ACM-SIAM Symposium on Discrete Algorithms, pp. 269-278 (2001).

M. Burrows et al.: "A block-sorting lossless data compression algorithm", SRC Research Report (1994).

* cited by examiner

Creating O(T) by sorting the rotations of T

T: $\$_1$ a b c $\$_2$ c a b $\$_3$ c a b

| oSort(T) | O(T) |
|---|---|
| $\$_1$ c a b $\$_2$ c a b $\$_3$ a b | c |
| $\$_2$ c a b $\$_3$ a b c $\$_1$ c a | b |
| $\$_3$ a b c $\$_1$ c a b $\$_2$ c a | b |
| a b $\$_2$ c a b $\$_3$ a b c $\$_1$ | c |
| a b $\$_3$ a b c $\$_1$ c a b $\$_2$ | c |
| a b c $\$_1$ c a b $\$_2$ c a b | $\$_3$ |
| b $\$_2$ c a b $\$_3$ a b c $\$_1$ c | a |
| b $\$_3$ a b c $\$_1$ c a b $\$_2$ c | a |
| b c $\$_1$ c a b $\$_2$ c a b $\$_3$ | a |
| c $\$_1$ c a b $\$_2$ c a b $\$_3$ a | b |
| c a b $\$_2$ c a b $\$_3$ a b c | $\$_1$ |
| c a b $\$_3$ a b c $\$_1$ c a b | $\$_2$ | oSort(T):
First characters of all rotations of T
alphabetically sorted by the suffixes which start with the first
character of the rotation and end at the next word delimiter O(T):
last characters of each sorted rotation

O*(T)                 oSort*(T)

| | | |
|---|---|---|
| a | b c $_2$ c a b $_3$ c a b | $_1$ |
| c | a b $_3$ c a b $_1$ a b c | $_2$ |
| c | a b $_1$ a b c $_2$ c a b | $_3$ |
| b | c $_2$ c a b $_3$ c a b $_1$ | a |
| b | $_3$ c a b $_1$ a b c $_2$ c | a |
| b | $_1$ a b c $_2$ c a b $_3$ c | a |
| c | $_2$ c a b $_3$ c a b $_1$ a | b |
| $_3$ | c a b $_1$ a b c $_2$ c a | b |
| $_1$ | a b c $_2$ c a b $_3$ c a | b |
| a | b $_3$ c a b $_1$ a b c $_2$ | c |
| a | b $_1$ a b c $_2$ c a b $_3$ | c |
| $_2$ | c a b $_3$ c a b $_1$ a b | c | oSort*(T):
First characters of all rotations of T
alphabetically sorted by the prefixes, i.e. where sorting starts
with the first character of the rotation and compares characters
backwards the rotation until the next word delimiter is reached O*(T):
second character of each sorted rotation

Fig. 1b

Deletion of the 2nd word

O*(T)        oSort*(T)

a            $_1
c            $_3
b            a
b            a
c            b
$_1          b
a            c
$_3          c

The word delimiter in O*(T), that separates the first word from the second in T prior to the deletion, separates the first from the third word after deleting the second word

Fig. 3

RunLength FM-Index applied to the example of Figure 1b

| B'(O*(T)) | B(O*(T)) | R(O*(T)) | O*(T) | oSort*(T) |
|---|---|---|---|---|
| 1 | 1 | a | a | $ |
| 0 | 1 | c | c | $ |
| 1 | 0 |   | c | $ |
| 1 | 1 | b | b | a |
| 1 | 1 |   | b | a |
| 0 | 0 |   | b | a |
| 1 | 1 | c | c | b |
| 1 | 1 | $ | $ | b |
| 0 | 0 |   | $ | b |
| 1 | 1 | a | a | c |
| 0 | 0 |   | a | c |
| 1 | 1 | $ | $ | c |

Fig. 5a

INDEXING COMPRESSED DATA

CROSS-REFERENCE TO PRIOR APPLICATIONS

This application is a U.S. National Phase application under 35 U.S.C. §371 of International Application No. PCT/EP2009/067499, filed on Dec. 18, 2009 and which claims benefit to German Patent Application No. 10 2009 052 886.5, filed on Nov. 13, 2009 and to German Patent Application No. 10 2009 047 026.3, filed Nov. 23, 2009. The International Application was published in English on May 19, 2011 as WO 2011/057680 A1 under PCT Article 21(2).

FIELD

1. Overview of the Invention

The present invention provides a method to compress and/or to decompress data, where a string (T) that consists of multiple given substrings is transferred into a permuted string (O(T), O*(T)) that can be sorted according to a given sorting criterion into a sorted, permuted string (oSort(T)) and (oSort*(T)).

Furthermore, the present invention comprises a device to execute the method as well as a computer program.

2. Background

WO 2007/031380 A2 describes a method to decompress data that performs an inverse Burrows-Wheeler-Transform. The Burrows-Wheeler-Transform is calculated by permuting a string that consists of a majority of words into a permuted string and then transforming it by sorting it according to the Burrows-Wheeler-Criterion into a sorted, permuted string. This compression and decompression method, which origins from Burrows, M. and Wheeler, D. J.: A block-sorting lossless data compression algorithm, SRC Research Report, 1994, Technical Report 124, digital equipment corporation, has the disadvantage that the whole string has to be transformed back in order to change or to delete a single word of the string. Therefore, changing the compressed data is relatively time and memory consuming.

SUMMARY

An aspect of the present invention is to provide a method or a device to compress and/or to decompress data, such that the processing of the compressed data (strings) is simplified. Especially, the searching, inserting, deleting and changing of the compressed data is simplified.

In an embodiment, the present invention provides A method to at least one of compress and decompress data includes providing a string (T) consisting of multiple given substrings. Identification symbols ($,$1,$2,$3) are assigned to the substrings of the string (T). The substrings of the string (T) are transferred by permutation into a permuted string (O(T),O*(T)). The permuted string (O(T),O*(T)) is sorted into a sorted permuted string (oSort(T), oSort*(T)) according to a given sorting criterion. The identification symbols ($,$1, $2,$3) are permuted and sorted together with the substrings of the sting (T) so that, in a partial inverse transformation step, characters of an Nth substring are sequentially determined within the permuted string (O(T),O*(T)) after determining a position (P) of an Nth identification symbol ($,$1,$2,$3) assigned to an Nth substring within the sorted permuted string (oSort(T),oSort*(T)) without reading characters of other substrings of the permuted string (O(T),O*(T)).

DETAILED DESCRIPTION OF THE DRAWINGS

The present invention is described in greater detail below on the basis of embodiments and of the drawings in which:

FIG. 1a a matrix to determine the permuted (encoded) string O(T) and the sorted permuted string oSort(T) in which the rotations of the string T are sorted according to the suffix of the first letter, FIG. 1b shows a matrix to determine the permuted (encoded) string O*(T) and the sorted permuted string oSort*(T) in which the rotations of the string T are sorted according to the rotated prefix of the first letter:

FIG. 3 shows a presentation of the vectors O*(T) and oSort*(T) after having deleted the second word of the string T;

FIG. 5a shows a table to represent the run length encoding, B(O*(T)) and R(O*(T)), of the permuted string O*(T);

DETAILED DESCRIPTION

Figure 2:
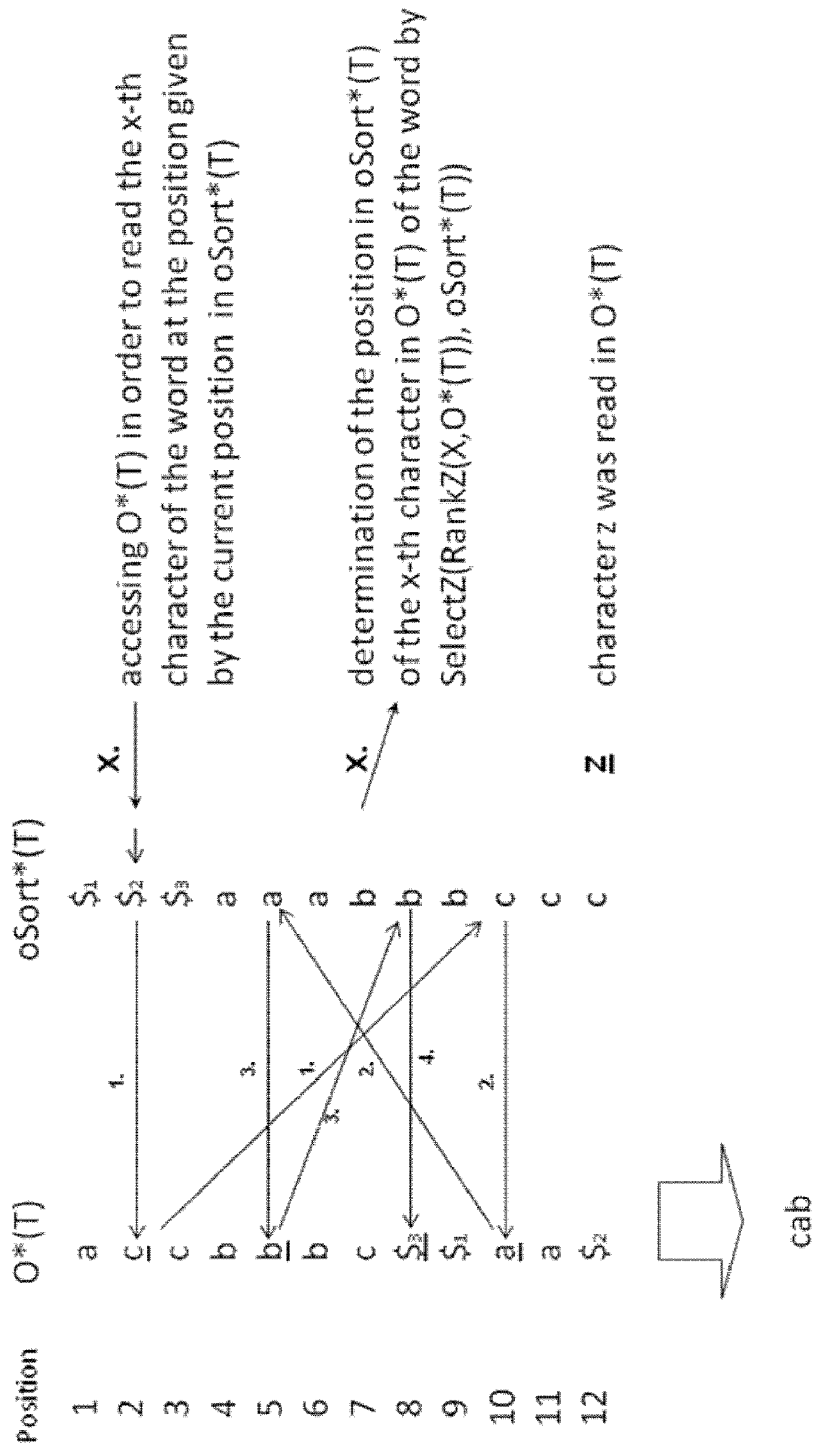
FIG. 2 shows a table to illustrate the reconstruction of the second word of the string T from the vectors O*(T) and oSort*(T)

According to the present invention, it is intended that each substring that represents a given content is assigned to an identification symbol, for example to a delimiter symbol. The string consists on the one hand of the substrings and on the other hand of the identification symbols that mark, for example, the beginning or the end of the substring, such that the string can be compressed by a Burrows-Wheeler-Transform (BWT), for example. As the substrings that can consist of several characters or of several bits is quasi-indexed by the identification symbols, an inverse transformation can be performed, by extracting only the substring that is identified by the identification symbol from the whole permuted string (O(T),O*(T)), without decompressing other parts of the permuted string. As an advantage, single substrings of the permuted string (O(T),O*(T)) can be decompressed, sorted, changed or deleted according to the present invention, without a need to process or decompress the other substrings of the permuted string. As an advantage, a partial decompression of the string can be performed, which saves time and memory resources. A complete decompression is no longer required. The substrings can be for example words or bits that represent parts of a picture and that represent a given content.

In an application of the present invention, the characters of the Nth substring can, for example, be determined sequentially by means of a mapping of the characters of the permuted string to the characters of the sorted permuted string according to a given specification on how to determine the positions. In order to determine a given character of the Nth substring of the string T, only a sorted permuted string represented by a sort vector is needed that calculates the given Nth substring, for example by means of a select function and a rank function in conjunction with the encoded string. The identification symbol in the sorted permuted string that represents the Nth identification symbol in the string (T) is an entry point for finding the other characters of the Nth substring within the encoded string (O(T), O*(T)). As an advantage, the sorted permuted string does not have to be stored; it can be calculated to reconstruct the Nth substring and can be deleted after the decompression of the Nth substring.

According to an extension of the present invention, the permuted string can be provided with a run length encoding in order to reduce memory consumption and/or a wavelet tree coding that further reduces the memory consumption.

An overview of the invention is presented in the following:

1.1 Contribution of the Present Invention:

Searching, inserting, deleting and updating in compressed strings without total decompression.

1.2 Methods to be Protected by Patent:

The methods to be protected by patent comprise:

1) The method oBWT is a modification of the -known method Burrows Wheeler Transform (BWT)[1].

2) mRLE (=modifiable Run Length Encoding) is an extension of run length encoding[3] by insertion, deletion, and update operations.

3) mWTC (=modifiable Wavelet tree Coding) is an extension of the Wavelet tree Coding[2] by insertion, deletion, and update operations.

These methods to be protected by patent allow transforming or compressing strings, such that any continuous substring can be searched or reconstructed from the compressed string without prior total decompression of the compressed string. Furthermore, these methods allow insertion, deletion, and update operations on continuous or non-continuous substrings of the compressed string without prior total decompression of the compressed string. An insertion, deletion, or update operation performed on the compressed string yields the same result as the decompression of the compressed string, followed by the insertion, deletion, or update operation on the decompressed string, followed by the recompression of the result of the operation.

1.3 Initial State:

A string T, e.g. a sequence of words, is given, whereas the words are separated by a word delimiter (e.g. $) that differs from all other characters of the string. Each character that occurs directly before a word delimiter is called the end of word, and each character that occurs directly after a word delimiter is called the beginning of a word. Moreover, the string need not necessarily be separated into words, but could be the data of a picture or any other file, and in order to split the string into substrings, instead of the "word delimiter" any identification symbol could be arbitrarily chosen from the character set of the string. In order to simplify the following specification, we restrict the discussion in paragraphs 3.1-3.22 to textual data, and words, and we discuss in 3.23, how these ideas can be extended to compress other (non-textual) data and data not containing words.

1.4 Data Structures and Concepts for Explaining the Methods:

Our methods work on the following data structures:

O(T)=a string that is generated by applying oBWT to the string T.

O*(T)=an alternative string to O(T) that is generated by applying oBWT to the string T. O*(T) can be used as an alternative to O(T) in each data structure and within each method except the methods described in 3.2. (check for O*(T) whether the Nth word of T is alphabetically less than a given word comparison) and in 3.12. (sortable classification). Whenever it is possible to simplify the description of the present invention, we describe the present invention only for one of both data structures, O(T), although the same ideas can be applied to the other data structure, O*(T), as well. Whenever the handling differs significantly for O*(T), we explain this handling explicitly.

B(T)=a bit sequence that is generated by applying mRLE to the string T.

R(T)=a string that is generated by applying mRLE to the string T.

W(T)=a string that is generated by applying mWTC to the string T.

The methods can be nested within each other, such that they work on the following data structures:

B(O(T))=a bit sequence that is generated by applying mRLE to the string that is generated by applying oBWT to the string T.

R(O(T))=a string that is generated by applying mRLE to the string that is generated by applying oBWT to the string T.

W(R(O(T)))=a string that is generated by applying mWTC to the string that is generated by applying mRLE to the string that is generated by applying oBWT to the string T.

The present invention takes advantage of the fact that the following holds for any string T:

T can be reconstructed from O(T),
T can be reconstructed from R(O(T)) and B(O(T)),
T can be reconstructed from W(R(O(T))) and B(O(T)).

As, in general, W(R(O(T))) and B(O(T)) together consume less storage space than T, it is favorable to store W(R(O(T))) and B(O(T)) instead of storing T. A fundamental contribution of the present invention is that insertion, deletion and update of any substrings, as e.g. sequences of words, in T can be simulated by modification operations on a) O(T) or
b) R(O(T)) and B(O(T)) or
c) W(R(O(T))) and B(O(T))

without a prior total decompression of the compressed string back to the uncompressed string T.

Alternatively, O*(T) can be used instead of O(T). Whenever it is possible to simplify the description of the present invention, we describe the present invention only for one of both data structures, O(T), although the same ideas can be applied to the other data structure, O*(T), as well.

1.5 Fundamental Properties of the Methods:

The methods provide the following properties:

1. For any number N, the Nth word of T can be reconstructed from O(T) or from R(O(T)) and B(O(T)) or from W(R(O(T))) and B(O(T)) without decompressing any of the data structures totally and without needing any index that points to the Nth word.

2. For any number N the following can be done: If a string Tnew has to be calculated for the string T by inserting a new word between the Nth and N+1$^{st}$ word of T, this operation on T can be simulated by operations on compressed data structures without decompressing them into T. More precisely, this operation can be simulated by operations on O(T) by transforming O(T) into O(T)new (without decompression of O(T) into T), in such a way that Tnew can be reconstructed from O(T)new. Furthermore, this operation can be simulated by operations on B(O(T)) and R(O(T)) by transforming B(O(T)) into B(O(T))new and R(O(T)) into R(O(T))new without decompression of B(O(T)) and R(O(T)) into T, in such a way that Tnew can be reconstructed from B(O(T))new and R(O(T))new.

Finally, this operation can be simulated by operations on B(O(T)) and W(R(O(T))) by transforming B(O(T)) into B(O(T))new and W(R(O(T))) into W(R(O(T)))new without decompression of O(T) into T, in such a way that Tnew can be reconstructed from B(O(T))new and W(R(O(T)))new.

All the operations simulating the insert do not require a total decompression into T.

3. For any number N, the Nth word of a string T can be deleted from O(T) without any decompression of O(T).

If a string Tnew has to calculated for the string T by deleting the Nth word from T, this operation can be simulated by operations on compressed data structures without decompressing them into T. More precisely, this operation can be simulated by transforming O(T) into O(T)new without decompression of O(T) into T, such that Tnew can be reconstructed from O(T)new. Furthermore, this operation can be simulated by operations on B(O(T)) and R(O(T)) by transforming B(O(T)) into B(O(T))new and R(O(T)) into R(O(T)) new without decompression of B(O(T)) and R(O(T)) into T, in such a way that Tnew can be reconstructed from B(O(T)) new and R(O(T))new.

Finally, this operation can be simulated by operations on B(O(T)) and W(R(O(T))) by transforming B(O(T)) into B(O(T))new and W(R(O(T))) into W(R(O(T)))new without decompression of O(T) into T, in such a way that Tnew can be reconstructed from B(O(T))new and W(R(O(T)))new.

All these operations do not require a total decompression.

4. For any number N, the Nth word can be updated. For this operation neither an additional index nor a total decompression is needed.

5. Any substring t of T, even if t contains word delimiters, can be searched and found directly in the compressed data structures. The search can be performed without total decompression of O(T), without total decompression of B(O(T)) and R(O(T)), and without total decompression of B(O(T)) and W(R(O(T))).

6. Insert operations can be performed locally on O(T) or on B(O(T)) and W(R(O(T))) at any position within T without needing a total decompression of T. The inserted substrings can even contain word delimiters. Only those words of T, into which some other word is inserted, need to be decompressed and recompressed.

7. Delete operations can be performed locally on any continuous substring of T without needing a total decompression. The deleted substrings can even contain word delimiters. Only those words of T that contain sub strings which are deleted need to be decompressed and recompressed.

8. Update operations can be performed locally on any continuous substring of T without needing a total decompression. Only those words of T that are modified by the update operation need to be decompressed and recompressed.

9. Direct search, insertion, update and deletion of substrings without a total decompression is not only possible for texts but for any arbitrary sequence of symbols.

2. Background of the Present Invention:

The present invention is based on a modification and an extension of the known methods Burrows Wheeler Transform (BWT) [1], Run length encoding (RLE)[3] and Wavelet tree Coding (WTC)[2] as well as on the known functions rank, select and sort.

2.1. Rank, Select and Sort

For a string (or bit sequence) T, T[P] is the Pth character (or bit) of T. Alternatively, the Pth character (or bit) of T is called the character (or bit) at position P within T.

Furthermore, for any string (or bit sequence) T, any Position P within T, and any character (or bit) Z, RankZ(P,T) is defined to be the number of characters (or bits) Z that occur within the prefix T[1], ..., T[P] of T. Furthermore, for any string (or bit sequence) T, and any character (or bit) Z, that occurs at least X times within T, SelectZ(X,T) is defined to be that position within T, for which T[P] is the Xth character Z within T.

Finally, Sort(T) is a permutation of the characters of T in alphabetical order.

2.2. Burrows Wheeler Transform (BWT)

The method BWT assumes that the end of the string T is terminated by a given text delimiter which does not occur anywhere else in T. BWT(T), the result of applying BWT to the string T, is a second string containing a permutation of the characters of T. The method BWT sorts all rotations of the string T based on the suffix (i.e., the remaining substring starting at the first character of the rotated string and ending at the text delimiter) and stores in BWT(T) for each rotation the circular predecessor of the first character of each rotation. This is called suffix sorting.

As an alternative to the termination of the string by a given text delimiter and by searching the position of the text delimiter whenever needed, the Position P of the last character of T within BWT(T) can be stored within additional memory.

The decompression of BWT(T) starts at this position P (where P is either the stored position or the position of the unique text delimiter within BWT(T)) and reads from BWT(T) the last character Ze of T and calculates the position of the preceding character Ze−1 of T by using the functions rank and select:

1. The rank R of the character Z at position P in BWT(T) is R=RankZ(P,BWT(T)).

2. The Position in BWT(T) of the preceding character Ze−1 is calculated by the direct access to the Rth character Z within the alphabetically ordered string Sort(BWT(T)), i.e., P=SelectZ(R, Sort(BWT(T))).

The decompression is continued, until all characters of the string T are reconstructed in the correct order.

The equivalent method BWT* sorts all rotations of the string T according to the prefix (i.e., the remaining substring reading circularly backwards starting at the first character of each rotated string and ending at the text delimiter) and stores in BWT*(T) for each rotation the circular successor of the first character. This is called prefix sorting.

Again, as an alternative to the termination of the string by a given text delimiter and by searching the position of the text delimiter whenever needed, the position P of the last character of T within BWT*(T) can be stored within additional memory.

The decompression of BWT*(T) starts at this position P (where P is either the stored position or the position of the unique text delimiter within BWT*(T)) and reads from BWT*(T) the first character Z1 of T and calculates the position P of the next character $Z_{i+1}$ of T by using the functions rank and select:

1. The rank R of a given character Z at position P in BWT*(T) is R=RankZ(P,BWT*(T)).

2. The position in BWT*(T) of the next character following Z in T is calculated by the direct access to the Rth character Z within the alphabetically ordered string Sort(BWT*(T)), i.e., P=SelectZ(R, Sort(BWT*(T))).

The decompression continues, until all characters of the string T are reconstructed in the correct order.

For example, if the character E was found within BWT*(T), and this is the $7^{th}$ E within BWT*(T), the index P of the $7^{th}$ E within the alphabetically ordered string Sort(BWT*(T)) of the characters of BWT*(T) is calculated. This index position P is the position of the next character of BWT*(T).

2.3. Run Length Encoding (RLE)

The run length encoding can be applied in the same way to BWT(T) and to BWT*(T). In order to simplify the presentation, we only specify the application to BWT(T). The run length encoding RLE applied to BWT(T) generates two data structures: a bit sequence B(BWT(T)) and a string R(BWT (T)). The bit sequence B(BWT(T)) contains one bit per character of BWT(T). This bit is a 1-bit, if the current character of BWT(T), BWT(T)[i], is the first character of BWT(T) (i.e., i=1) or if the current character differs from the preceding character of BWT(T), BWT(T)[i−1]. The bit is a 0-bit, if both characters, BWT(T)[i] and BWT(T)[i−1] are equal. By specifying this bit sequence, R(BWT(T)) has to contain only those characters that differ from the preceding character. Correspondingly, the string R(BWT(T)) that is generated by applying RLE to BWT(T) contains for each run of length K (K>=1) of K continuous equal characters within BWT(T) only the first character.

RankB(A, BF) and SelectB(A, BF) are defined for bit sequences similar as for strings. Let B'(BWT(T)) be a bit vector which represents the alphabetical order of the bit vector B(BWT(T)) according to the corresponding character of R(BWT(T)). In other words, B(BWT(T))[N]=B'(BWT(T))[P], where P is the position of BWT(T)[N] within Sort(BWT(T)). Let furthermore C[Z] contain the number of the characters of BWT(T) that are alphabetically less than Z. Then, RankZ(A, BWT(T)) can be calculated as follows from R(BWT(T)), B(BWT(T)) and B'(BWT(T)) (c.f. [3]).

```
ofs = 0;
I' = Rank1(A, B(BWT(T)));   //#runs until A
J' = RankZ(I', R(BWT(T)));   //#runs of Z until position I' in R(BWT(T))
J = Select1(C[Z] + 1, B'(BWT(T)));   // Position, where run of Z in B'(BWT(T))
// Does Z belong to the run at position A in BWT(T)?
// If yes, what is the position of Z within the run
if ( R(BWT(T))[I'] == Z ) {
    J' = J' − 1; // Only the runs of Z without the last run
    // corresponding part of the run of Z at position A
    ofs = A − Select1(I', B(BWT(T))) + 1 ;
}
RETURN Select1(C[Z] + 1 + J', B'(BWT(T))) + ofs − J;
```

The returned value for the rank is computed as follows: the position where the run of the searched character Z in B'(BWT(T)) starts plus the position ofs of the searched character Z in his run minus J, the position of the beginning of the first run of Z in B'(BWT(T)).

SelectZ(X, BWT(T)) can be calculated in a similar manner:

```
ofs = 0;
J = Select1(C[Z]+1, B'(BWT(T))); // Position, where the run of Z in B'(BWT(T))
J' = J + X + 1; // Position J' of the searched character Z in B'(BWT(T)))
O = Rank1(J', B'(BWT(T))) // #runs until the position of the searched character Z
O' = O − ( C[Z] + 1 ) + 1 // #runs of Z before the searched Z
// Is the position of the Xth Z within a run?
    // If yes, what is the position of Z within the run?
    If ( B'(BWT(T))[J']==0 ) {
        // Position of the searched Z within the run of Zs
        ofs = Rank0(J', B'(BWT(T))) − Rank0(Select1(O, B'(BWT(T))), B'(BWT(T)));
    }
    V = SelectZ(O', R(BWT(T))) // Position of the corresponding run of Z in R(BWT(T))
    RETURN Select1(V, B(BWT(T))) + ofs ;
```

The value to be returned for Select is computed as follows: the position of the corresponding run of the searched character Z in B(BWT(T)) plus the position of the searched Z within the run of Z.

2.4. Wavelet Tree

The Wavelet tree is a binary tree where each node that is not a leaf node has a left and a right child node of which we say that they occur 1 level below within the Wavelet tree. Each leaf node of the Wavelet tree represents one character of the alphabet of all the characters stored in the Wavelet tree.

The Wavelet tree Coding WTC encodes a string T as bit sequences that are stored in the non-leaf nodes of a Wavelet tree. Thereby, each character of the string is stored similar to the Huffman encoding as a sequence of bits. The bits of each encoded character are distributed within in the Wavelet tree in such a way that the first bit of the Huffman code of a character is stored in the root node of the Wavelet tree and each of the following bits is stored in an inner node of the Huffman tree that is exactly 1 level below the node that stores the preceding bit in the Wavelet tree.

In which nodes of the Wavelet tree the bits of the Huffman code of a character are stored, depends on whether the current bit is a 0-bit or a 1-bit. Whenever the current bit of the Huffman code of a character is a 0-bit, the parsing and storing of the next bits of the Huffman code of the character is continued in the left sub-tree. Otherwise, it is continued in the right sub-tree of the Wavelet tree. When all bits of the Huffman code of a character are stored, the last 0- or 1-bit determines exactly one leaf node of the Wavelet tree. This leaf node represents the character that corresponds to the Huffman code. Leaf nodes do not contain bits and do not need to be stored.

For an inner node K of the Wavelet tree, let Bitsequence(K) be the bit sequence that is represented by this node, and, for a character Z, let Leaf(Z) be the leaf node that corresponds to this character. Then, RankZ(N,K) is defined for a character Z, a Position N and a node K of the Wavelet tree as follows:

```
RankZ(N,K)
    if (Leaf(Z) occurs within the left sub-tree of K){
        I = 0; K' = left child node of K;
    }
    else{
        I = 1; K' = right child node of K;
    }
    N = RankI(N, Bitsequence(K));
    if (K' is a leaf node) RETURN N;
    else RETURN RankZ(N, K');
    Let Root(W(R(O(T)))) be the root node of W(R(O(T))). Then,
RankZ(N, R(O(T))) = RankZ(N, Root(W(R(O(T))))).
```

In a similar manner, Select(N,K) for a Position N and a node K of the Wavelet tree can be calculated as follows:

```
Select(N,K)
    if (K is the root node) RETURN N
    K' = parent node of K;
    if (K is the left child node of K')
        N = Select0(N, Bitsequence (K'));
    else
        N = Select1(N, Bitsequence (K'));
    RETURN Select(N, K');
    Let Z be a character in R(O(T)) and let Leaf(Z) be the
corresponding leaf node in W(R(O(T))).   Then, SelectZ(N,R(O(T))) =
Select ( N, Leaf(Z)).
```

2.5. Weaknesses and Disadvantages of the Known Methods

The known methods are usually used in nested manner, i.e., a string T is transformed into a compressed representation consisting of the data structures B(BWT(T)) and W(R(BWT(T))), out of which T can be reconstructed by total decompression.

When using the known methods, a total decompression is needed for

- Deleting the Nth word of a string T (for the advantage of the present invention, see 3.3, 3.7 and 3.8)
- Inserting a new word as the Nth word of a string T (for the advantage of the present invention, see 3.4 and 3.9)
- Updating the Nth word of a string T (for the advantage of the present invention, see 3.5)
- Alphabetically sorting and classifying words and creating all pairs of words that fulfill certain join conditions (for the advantage of the present invention, 3.11. and 3.12.).
- Searching any given substring that even may contain word delimiters (for the advantage of the present invention, see 3.13)
- Searching a substring that starts at a given position within the string T or at a given position of the compressed string O(T) (for the advantage of the present invention, see 3.14 and 3.15)
- Deleting, inserting and updating substrings of any length (for the advantage of the present invention, see 3.16 and 3.22)

3. Basic Idea and Inventions Behind the Methods to be Protected by Patent:

3.1. Calculating O(T) or O*(T) Respectively and Searching the Nth Word in O(T) or in O*(T)

The calculation of the string O(T) from a given string T according to FIG. 1a is similar to the known calculation of BWT(T) from a given string T besides the following significant differences during the suffix sorting:

1. There is no end-of-text delimiter for the calculation of O(T). Instead, the last word of the string T is terminated by a word delimiter.

2. When sorting all the rotations of T, the word delimiters (e.g. $) are weighted in such a way, that the order of the word delimiters within the sorted string corresponds to the order of the word delimiters within the original string T. That is, for each N, the Nth word delimiter is treated as alphabetically less than the word delimiter of the $N+1^{st}$ word. The order of the first characters of all rotations of T that is yielded by this sorting is called oSort(T), i.e., the order of the word delimiters within oSort(T) corresponds to the order of the word delimiters within T. O(T) contains at each position P the character of T that occurs directly in front of that character that occurs in oSort(T) at the same position P.

Thus, the last character of the N-th word (assuming that the Nth word is non-empty) can be found in O(T) at that position P, at which oSort(T) contains the Nth word delimiter. This last character of the Nth word is called the end of word of the Nth word in the remainder of this specification. If the last character of the Nth word is a word delimiter, the Nth word is empty.

So, whenever the Position P of the Nth word delimiter within oSort(T) is found, at the same time, the Position P of the Nth end of word is found within O(T). oSort(T) can be calculated from O(T) by sorting the characters of O(T) alphabetically without considering the order of the word delimiters.

Thus, the Nth word can be reconstructed from O(T) starting with the Nth word delimiter. The preceding characters in O(T) of each word are found via the usual BWT search method. Thereby the searched word is complete when a word delimiter is found in O(T).

Alternatively, instead of calculating O(T) by means of a modified suffix sorting, O*(T) can be calculated by means of a modified prefix sorting according to FIG. 1b, which yields the same properties and advantages as O(T) in comparison to BWT(T). That is, O*(T) is calculated in a similar manner as BWT*(T), but in contrast to BWT*(T), the word delimiters are weighted according to the order of their occurrence in T during the prefix sorting of all rotations.

In comparison to the known calculation of BWT*(T), there are the following significant differences:

1. There is no end-of-text delimiter for the calculation of O*(T). Instead, the last word of the text T is terminated by a word delimiter.

2. Again, when sorting all the rotations of T, the word delimiters (e.g. $) are weighted in such a way that the order of the word delimiters within the sorted string corresponds to the order of the word delimiters within the original string T with the following exception: the last word delimiter of T gets such a weight, that the last word delimiter of T is within the sorted permutation oSort*(T) treated as the word delimiter of the first word of T, or shortly as the first word delimiter.

Thus, for each N, the Nth word delimiter is treated as if it is alphabetically less than the $N+1^{st}$ word delimiter—and, as additionally the text delimiter precedes in each rotation the first character of the first word, the Nth word delimiter precedes the first character of the Nth word.

The order of the first characters of all rotations of T that is achieved by this sorting is called oSort*(T), i.e., the order of the word delimiters within oSort*(T) corresponds to the order of the word delimiters within T with the exception that the last word delimiter occurs at position 1. O*(T) contains at each position P the character of T that occurs directly behind that character that occurs in oSort*(T) at the same position P.

Thus, the first character of the Nth word (assuming that the Nth word is non-empty) can be found in O*(T) at that position P, at which oSort*(T) contains the Nth word delimiter. This first character of the Nth word is called the beginning of word of the Nth word in the remainder of this specification. If the first character of the Nth word is a word delimiter, the Nth word is empty.

So, whenever the position P of the Nth word delimiter within oSort*(T) is found, at the same time the position P of the Nth end of word is found within O*(T). oSort*(T) can be calculated from O*(T) by sorting the characters of O*(T) alphabetically without considering the order of the word delimiters.

Thus, the Nth word can be reconstructed from O*(T) starting with the Nth word delimiter.

In principle, we can search forwards and backwards in BWT(T) and in BWT*(T) by means of the operations rank and select as described above. With the same method, we can search forwards and backwards within a word in O(T) and in O*(T).

When searching the corresponding word delimiters in O(T) and O*(T), only one direction is supported via direct access: As O(T) was calculated by means of a suffix array, we can find the position P of the Nth word delimiter in oSort(T) and thus the position P of the end of the Nth word in O(T) via Select$(N,oSort(T)) directly (i.e., without total decompression). Afterwards, we find all previous characters of the Nth word in O(T) via navigation with the operations rank and select. Or alternatively, we can find via navigation with the operations rank and select the position P2 of the end of a word in O(T) and determine via Rank$(P2,oSort(T)) the rank of the word delimiter within oSort(T), and thus determine the position of the current word within the sequence of words of T.

As O*(T) was calculated by means of a prefix array, the opposite search direction applies to O*(T). We can find the Position P of the Nth word delimiter in OSort*(T) and thus the position P of the beginning of the Nth word in O*(T) via Select$(N,oSort*(T)) directly (i.e., without total decompression). Afterwards, we find all following characters of the Nth word in O*(T) via navigation with the operations rank and select. Or alternatively, we can find via navigation with the operations rank and select the Position P2 of the beginning of a word in O*(T) and determine via Rank$(P2,oSort*(T)) the rank of the word delimiter within oSort*(T), and thus determine the position of the current word within the sequence of words of T.

When searching any string, we use the supported direction of search. That is, in order to determine the position of a word found in O(T) within the sequence of words within T, we search via rank and select the word delimiter at the end of the word. In contrast, in O*(T), we search the word delimiter at the beginning of the word. Furthermore, in order to find the Nth word, we search the character at position Select$(N, oSort(T)) in O(T) and in O*(T).

This character is the last character of the word in O(T) and the first character of the word in O*(T). In O(T), we search via rank and select the preceding character of a word until we reach a word delimiter, and in O*(T), we search via rank and select the following character of a word until we reach a word delimiter.

In order to simplify the following description, we describe the present invention only for O(T), although the same ideas can be applied to O*(T).

As an alternative, we can weight the word delimiters (e.g. $) during the sorting of the rotations in such a way that, for each N, the Nth word delimiter is treated as if it is alphabetically greater than the N+1$^{st}$ word delimiter. This way, only the mapping from word delimiters in T to the word delimiters in oSort(T) or oSort*(T) is modified, i.e., if COUNT($) is the number of word delimiters, the Xth word delimiter in T corresponds to the COUNT($)<X+1$^{st}$ word delimiter in oSort(T) or in oSort*(T). The present invention includes this case and all other cases where an invertible mapping from word delimiters in T to word delimiters in oSort(T), oSort*(T) exists.

In order to simplify this description, we restrict the description of the present invention to the case that the Nth word delimiter is treated as alphabetically less than the N+1$^{st}$ word delimiter.

3.2. Check whether the Nth word in T is <=, =, < >, >, or => as a given word

In order to check for O*(T) whether the Nth word of T is alphabetically less than a given word, we can read the characters of the Nth word starting in O*(T) at the position of the Nth word delimiter within oSort*(T) and simultaneously read the characters of the given word.

If the character read in O*(T) and the character read in the given word are both a word delimiter (e.g. $), the Nth word is equal to the given word. Otherwise, if the character read in O*(T) is a word delimiter, the Nth word in T is alphabetically less than the given word. Otherwise, if the character read in O*(T) is alphabetically less than the character read in the given word, the Nth word of T is alphabetically less than the given word. Otherwise, if the character read in the given word is a word delimiter and the character read in O*(T) is no word delimiter, the Nth word in T is alphabetically greater than the given word.

If neither the character read in O*(T) nor the character read in the given word is a word delimiter, the following holds: If the character read in O*(T) is alphabetically less than the character read in the given word, the Nth word in T is alphabetically less than the given word. If the character read in O*(T) is alphabetically greater than the character read in the given word, the Nth word in T is alphabetically greater than the given word. Otherwise, we continue with the next character of the given word and the next character of the Nth word in O*(T). Let P be the position of the current character Z of the Nth word in O*(T), then the position P2 of the next character of the Nth word in O*(T) is P2=SelectZ(RankZ(O*(T)), oSort*(T)).

```
Function LessThanGreaterThanOrEquals ( N, Given )
{   P = Select$( N , oSort*(T) ) ;
    RETURN LtGtOrEq ( P, 1, Given ) ;
}
Function LtGtOrEq ( Tpos, Gpos, Given ) ;
{   Z = O*(T) [ Tpos ] ;
    If ( Z == '$'  AND  Given [ Gpos ] == '$' ) RETURN "equals" ;
    If ( Z== '$' ) RETURN "less";
    If ( Given [ Gpos ] == '$' ) RETURN "greater " ;
    If ( Z < Given [ Gpos ] ) RETURN "less" ;
    If ( Z > Given [ Gpos ] ) RETURN "greater" ;
    P2 = SelectZ( RankZ( Tpos, O*(T) ) , oSort*(T) )
    Return LtGtOrEq ( P2, Gpos+1 , Given ) ;
}
```

The search of words in O(T) that are equal or non-equal to a given word can be done in the same way when starting at the beginning or at the end of the word because, for checking equality or non-equality, it does not matter whether to compare two words from the beginning to the end or the other way round.

This method of searching words that are <, <=, >, >=, = or < > a given word works accordingly in B(O(T)) and R(O(T)) or in B(O(T)) and W(R(O(T))) or in B(O*(T)) and R(O*(T)) or in B(O*(T)) and W(R(O*(T))).

3.3. Deleting the Nth Word in O(T), O*(T)

In order to simulate the deletion of the Nth word in T by similar operations in O(T) or in O*(T), we do the following (c.f. FIG. 2). We search the Nth word delimiter in O*(T) and mark it as to be deleted. By means of the method described in section 3.1, we search all other characters of the word to be deleted and mark them to be deleted as well, until we have found a word delimiter (which represents the end of the word to be deleted). All characters that are marked as to be deleted are deleted from O*(T) (c.f. FIG. 3). The sequence of characters in O*(T) that are not marked to be deleted are the characters that can be used for building the string O*(T)new which is the same string that is achieved when decompressing O*(T) into T, then deleting the Nth word from T, and finally compressing the result to O*(T)new.

3.4. Inserting a New Word as the Nth Word in O(T), O*(T)

Figure 4:
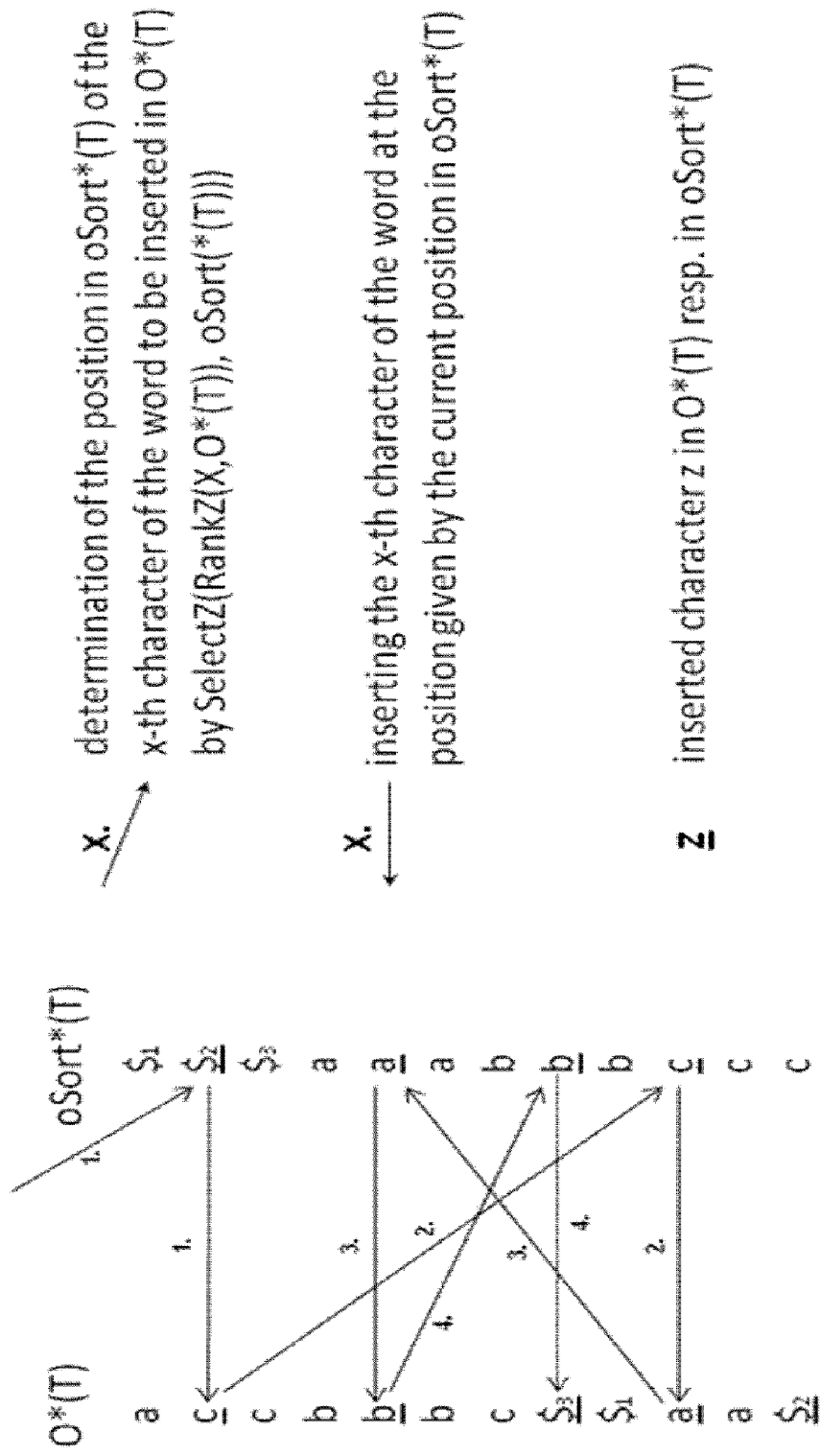
FIG. 4 shows a table to represent the insertion of the word "cab" as second word into the string T that is available in its compressed form O*(T)

In order to simulate the insertion of a word as the Nth word into T by operations on O(T), i.e., to insert the new word behind the N−1$^{st}$ word in T and in front of the word that was the Nth word before the insertion (and will be the N+1$^{st}$ word after the insertion), we do the following. The word to be inserted is read character by character (c.f. FIG. 4) starting at the last (in O*(T) starting at the first) character E of the word. At the beginning, the current insertion position in O(T) is the position P of the Nth word delimiter (e.g. $) within oSort(T), i.e., it is P=Select$(N,oSortT)). The character E is inserted in O(T) at position P, i.e., in O(T) between the characters O(T)[P−1] and O(T)[P]. Thus, all positions greater or equal to P of characters in O(T) are increased by 1. Then, the rank R of the inserted character E in O(T) is calculated, R=RankE(P,O(T)). Afterwards, we calculate by means of the sorted string oSort (T) the position of the newly inserted character E. This position is that position at which the preceding (or in O*(T) the following) character has to be inserted. We continue in a similar manner with all other characters of the word to be inserted, until a word delimiter for the beginning of the word (or in O*(T) for the end of the word) of the word to be inserted is reached and inserted into O(T).

3.5. Updating the Nth Word in O(T) or O*(T)

In order to update the Nth word, we can delete the Nth word and insert a new word as the Nth word.

3.6. Searching the Nth Word in the Run Length Encoding of the String, i.e., in R(O(T)) and B(O(T)) or in the Wavelet Tree Coding, i.e., in W(R(O(T))) and B(O(T))

The word delimiter is weighted during the sorting of the rotations of T in such a way that all rotations that start with a word delimiter are positioned consecutively in the order of the word delimiters in T.

Via Select\$(N, oSort(T)), we get in O(T) the position of the last character of the Nth word of T or we get in O*(T) the position of the first character of the Nth word of T.

As the run length encoding RLE and our modified run length encoding mRLE are order preserving, we can calculate the relevant position in R(O(T)) and in B(O(T)) or the relevant position in R(O(T)) and in W(B(O(T))) respectively from the calculated position in O(T).

Thus, the end of the Nth word can be found in R(O(T)) and B(O(T)) or in R(O(T)) and W(B(O(T))) respectively via access to the Nth word delimiter. The preceding characters of the word can be found in our method mRLE as described above by using the method to search the preceding character for the usual RLE, but by performing the search on R(O(T)) and B(O(T)) or on R(O(T)) and W(B(O(T))) respectively. The searched word is complete or terminated when a word delimiter has been found.

3.7. Deleting the Nth Word from R(O(T)) and B(O(T)) or from W(R(O(T))) and B(O(T))

We search the Nth word delimiter in R(O(T)) and in B(O(T)) and mark the bit in B(O(T)) corresponding to the word delimiter as to be deleted. We treat all other characters of the word in a similar way with, until a word delimiter is reached. When deleting marked bits from B(O(T)) it has to be checked whether the deletion changes the existing runs that represent consecutive identical characters in O(T).

The deletion of a 0-bit from B(O(T)) does not change existing runs and thus does not require any changes of R(O(T)) and of the Wavelet tree W(R(O(T))) representing R(O(T)).

If a 1-bit is being deleted from B(O(T)) that is followed by a 0-bit that is not being deleted from B(O(T)), no run has changed and thus no changes in R(O(T)) and no changes in the Wavelet tree W(RO(T))) representing R(O(T)) are required. In B(O(T)) the 0-bit that follows the deleted 1-bit has to be changed into a 1-bit.

If, otherwise, a 1-bit is being deleted that is followed in B(O(T)) by another 1-bit, the character that corresponds to the first 1-bit has to be deleted from R(O(T)) and thus from the Wavelet tree W(R(O(T))) representing R(O(T)).

The Nth word is being deleted from W(R(O(T))) by deleting all characters from W(R(O(T))) that correspond to a 1-bit followed by a second 1-bit in B(O(T)).

When searching a character to be deleted from W(R(O(T))), the bits of those nodes of the Wavelet tree W(R(O(T))) are marked that represent the Huffman code of this character within the current node. Finally, the marked bits can be deleted from the Wavelet tree.

3.8. Optimizing the Deletion of the Nth Word in R(O(T)) and B(O(T))

If a sequence of continuous 1-bits is being deleted from B(O(T)) that is followed by a 1-bit, all characters of R(O(T)) and of the Wavelet tree W(R(O(T))) representing R(O(T)) that correspond to this sequence of continuous 1-bits have to be deleted. If in R(O(T)) the characters in front of and behind the characters to be deleted are equal, the following optimization can be performed:

The 1-bit that follows the sequence of 1-bits to be deleted, i.e., the first 1-bit of the consecutive run in B(O(T)) is replaced by a 0-bit and that character in R(O(T)) that follows the characters to be deleted in R(O(T)), i.e., the character of the following run can be deleted from R(O(T)) and thus from the Wavelet tree W(R(O(T))) representing R(O(T)).

3.9. Inserting a New Word as the Nth Word in R(O(T)) and B(O(T)) or in W(R(O(T))) and B(O(T))

We want to simulate on R(O(T)) and B(O(T)) or on W(R(O(T))) and on B(O(T)) the insertion of a new word as the Nth word into T. In order to insert a new word as the Nth word, i.e., behind the N–$1^{st}$ word in R(O(T)) and B(O(T)) or in W(R(O(T))) and B(O(T)), we do the following:

The last (or in O*(T) the first) character of the word is inserted in R(O(T)) and B(O(T)) or in W(R(O(T))) and B(O(T)) at the position that corresponds to the position N in O(T). The rank of the inserted character within oSort(O(T)) determines the insertion position of the next character of the word. This is continued until the word delimiter is inserted.

Figure 5B:
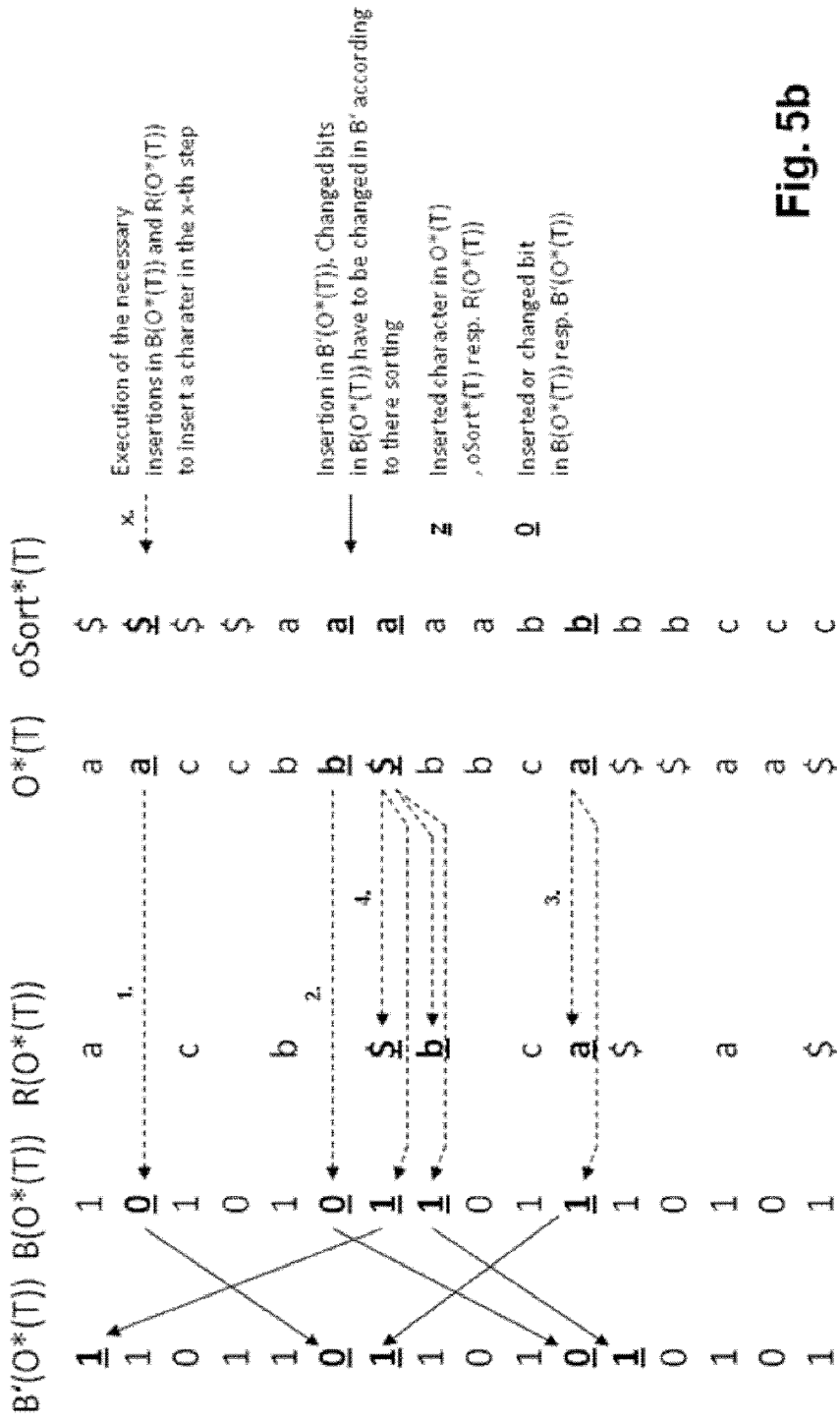
FIG. 5b shows a table to illustrate the insertion of the word "aba" at position 2 into the run length encoding, B(O*(T)) and R(O*(T)), of the permuted string O*(T)
Figure 6A:
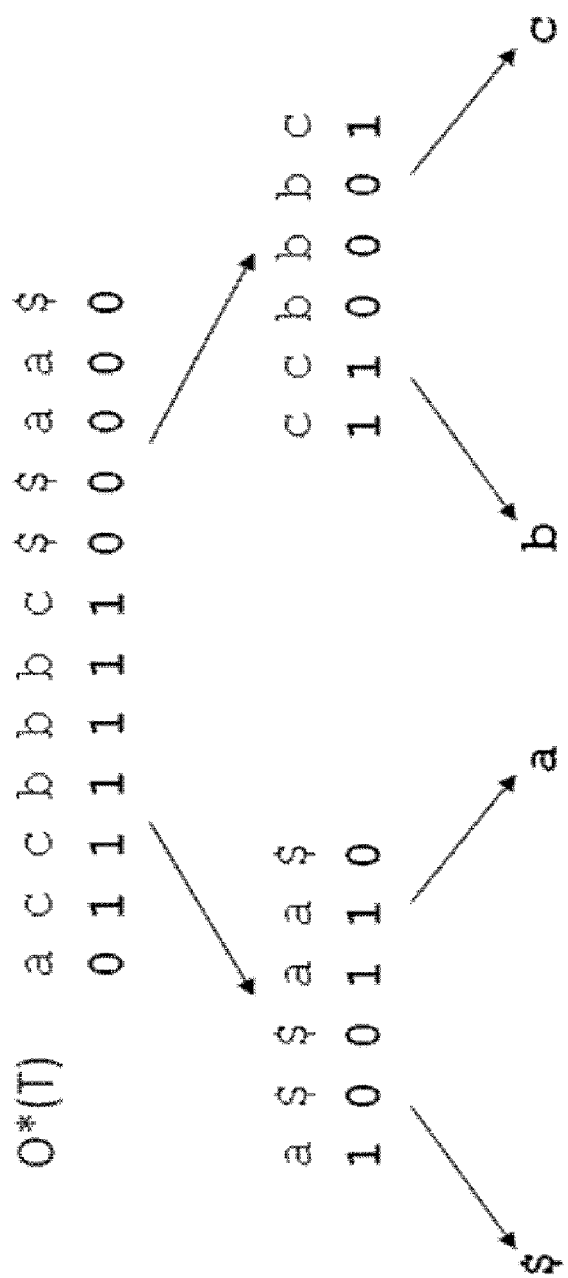
FIG. 6a shows a table to illustrate the string O*(T) encoded by the wavelet tree coding.
Figure 6B:
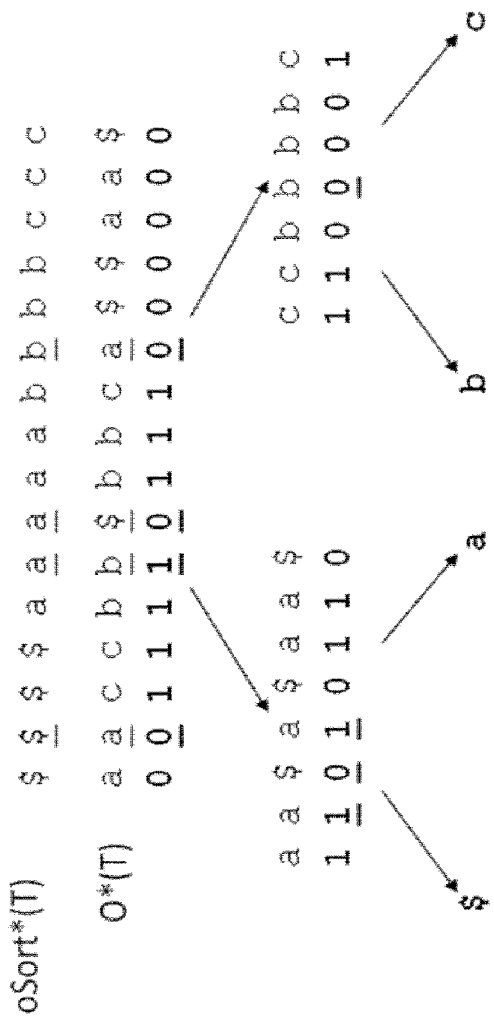
FIG. 6b shows a table to illustrate the insertion of the word "aba" at position 2 within the string encoded by wavelet tree coding.

In order to insert a character Z at position N into R(O(T)) and B(O(T)) (c.f. FIGS. 5a and 5b) or into W(R(O(T))) and B(O(T)) (c.f. FIGS. 6a and 6b) that corresponds to the position N in O(T), we do the following:

We insert a bit at position N in B(O(T)). If the bit to be inserted is not inserted at the first position and if the bit at position N–1 represents the same character Z, we insert a 0-bit. Otherwise, the bit to be inserted is a 1-bit and the following two cases have to be distinguished: If the bit to be inserted is not the last bit in B(O(T)) and the bit following the bit to be inserted in B(O(T)) represents the same character Z, we change the bit following the bit to be inserted into a 0-bit. Otherwise, we insert the character Z at position N2 that corresponds to the Nth character of O(T) into R(O(T)) or into W(R(O(T))) respectively. The insertion position is Rank1(N, B(O(T))).

In order to implement this insertion of Z at position N2 in R(O(T)) into the Wavelet tree, Z is inserted at position N2 in W(R(O(T))) as follows. The insertion position within the root node of W(R(O(T))) is N2 as well.

The insertion of bits into nodes of W(R(O(T))) is continued recursively in the bit sequences B(K) of the nodes K of the Wavelet tree until a leaf of W(R(O(T))) is reached that represents the character Z. If the leaf that represents Z is not yet reached, we distinguish two cases:

a) Z belongs to the set of characters that are represented by leaf nodes within the left sub-tree of the current node K. This is the case, if the current bit of the Huffman code of Z to be stored is a 0-Bit. Then, we insert a 0-bit at the insertion position N2 in B(K) and calculate the rank R of this 0-bit within the current bit sequence, i.e. R=Rank0(N2, B(K)). The insertion is continued recursively within the left child node of the current node in W(R(O(T))). R is the new insertion position N2 for the next recursion step.

b) Z belongs to the set of characters that are represented by leaf nodes within the right sub-tree of the current node K. This is the case, if the bit of the Huffman code of Z to be stored is a 1-bit. Then, we insert a 1-bit at the insertion position N2 in B(K) and calculate the rank R of this 1-bit within the current bit sequence, i.e. R=Rank1(N2, B(K)). The insertion is continued recursively within the right child node of the current node in W(R(O(T))). R is the new insertion position N2 for the next recursion step.

3.10. Splitting O(T) into Compressed Partitions without Total Decompression

We describe how to split O(T) into N partitions without decompression followed by recompression, such that each word of T is contained in exactly one partition. We assume that, for each word in O(T) or for each word delimiter in sSort(T) respectively, the number of the partition to which this word shall belong after partitioning is given and is stored using log(N) bits for each word delimiter found in oSort(T).

For the partitioning algorithm, we assign to each character in O(T) an additional memory S having the size of log(N) bits, in which the partitioning algorithm encodes the partition to which the character belongs. Each word in O(T) is read backwards character by character beginning at the end of the word. (In O*(T), each word is read forwards character by character beginning at the beginning of the word.) The partition of the word delimiter is written into the memory S assigned to each character of that word.

When all words are read and a partition is assigned to all characters of O(T), O(T) is read linearly starting at the beginning and each character is added to that partition string that is identified by the content of the assigned memory S.

The partition strings generated by this method are correct according to oBWT and an extraction followed by a direct compression of the words contained in each of the N partitions would yield the same result.

This method to split O*(T) or to split B(O(T)) and R(O(T)) or to split B(O(T)) and W(R(O(T))) or to split B(O*(T)) and R(O*(T)) or to split B(O*(T)) and W(R(O*(T))) marks the mapping of characters to partitions accordingly. Furthermore, we have to care that the encoding of the runs in run length encoding is done correctly when calculating each partition—similar as when deleting words.

3.11. Classifying Words and Finding all Join Pairs of Words Via Backward Search

We describe how to classify all words of O(T) or O*(T) in such a way that each class consists of pair-wise identical words, and we describe how to determine for each word, to which class the word belongs.

We start the classification of words at the word delimiters in O(T) or O*(T).

Figure 7:
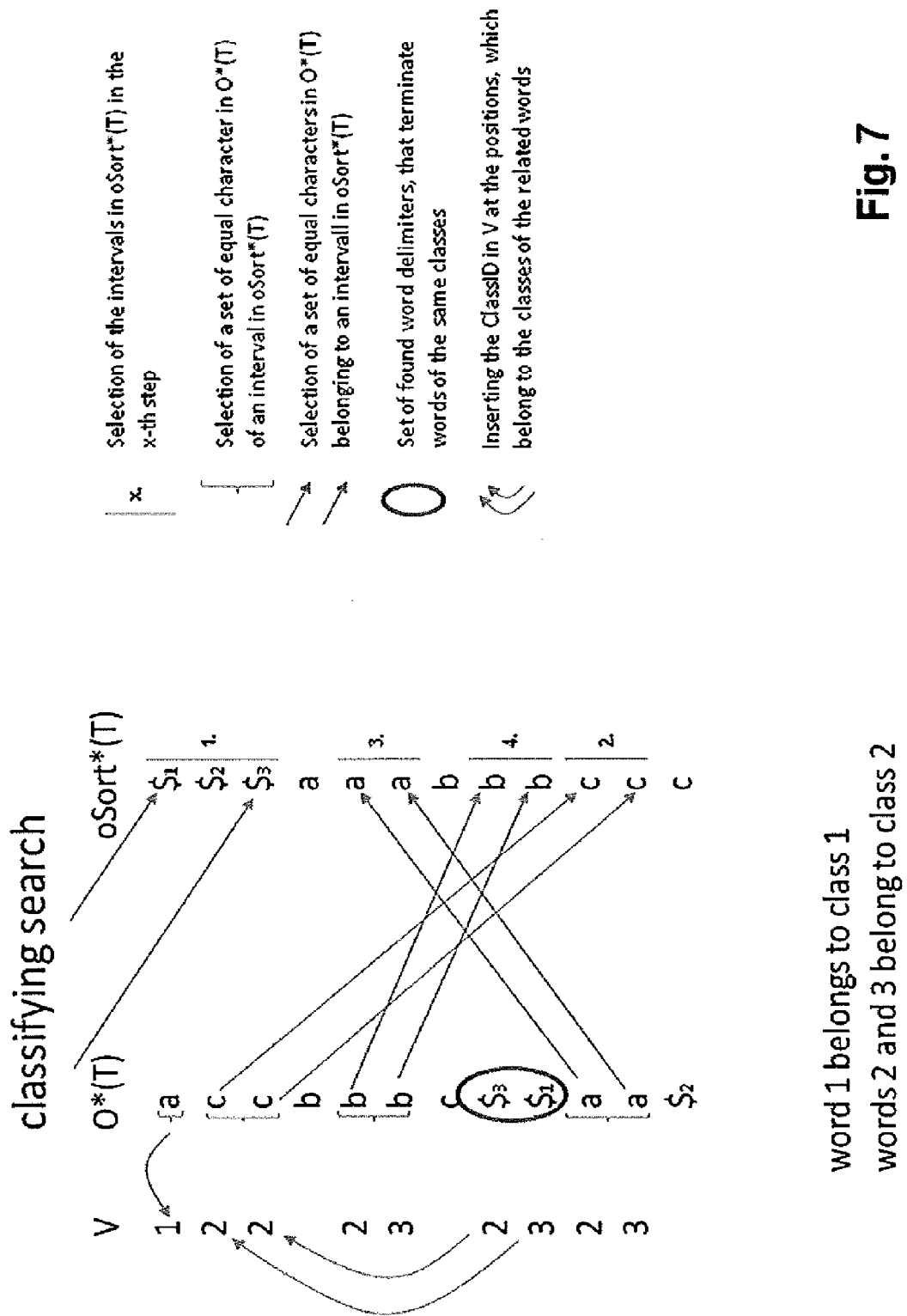
FIG. 7 shows a table to illustrate the classification of words.

We read the words in O(T) starting at the beginning or the words in O*(T) starting at the end—but beside of this, the method is identical for both cases. We describe the method exemplarily for O*(T) according to FIG. 7 in order to clarify the difference to the classification that is outlined in the next section and precedes forwards.

Initially, the classification algorithm marks within a vector V all N word delimiters in oSort*(T) as a singleton class, by writing different values into the vector v that represents the classification. The classification algorithm is a backtracking algorithm that starts with the set M of the position P1, ..., PN of the word delimiters in O*(T), i.e., at those P1, ..., PN with O*(T)[Pi]='$' for i=1, ..., N.

```
N= Rank$( | O*(T) | , O*(T) ) ;
For ( i=1 .. N ) V [ i ]= i ;   // assign a different class to each word
M = { Pi | O*(T)[Pi] = '$' }
Classify( M ) ;
```

Within each step of Classify(M), the set M of positions is split into k disjoint subsets M1, ..., Mk, where k is the number of different characters stored in oSort*(T) at the positions given by M. For each such subset Mi of positions, we have to distinguish 3 cases:

1. If the set Mi is a singleton set, we cannot split it further into subsets, i.e., the search can be stopped.

2. If Mi contains positions where oSort*(T) contains word delimiters, all these positions belong to the same class, as these word delimiters terminate the same words.

3. Otherwise, the classification is continued with the character that precedes the current character in the word, in order to check whether the positions of Mi belong to the same or to different words.

```
Classify( M )
{   M1...Mk = split( M ) ; // group positions pi in M according to the corresponding
        // character oSort*(T)[Pi], positions Pi with the same
        // character oSort*(T)[Pi] belong to the same subset Mj
        For( i=1 .. k )
    { if   ( | Mi | == 1 )   // found singleton, nothing more to do
        else if ( character of Mi is '$' )
            Generate a new class ID CID and store in V that all word
            delimiters of Mi belong to the class CID
        else { M2 = Search predecessors of the positions Mi in O*(T);
            Classify ( M2 ) ;
        }
    }
}
```

Let Z be the character occurring at all the positions P1, ..., Pm ∈ Mi in oSort*(T), i.e., Z=oSort*(T)[P1] for all Pi of Mi. The search of the position Pinew of the preceding character in T of each character at a position Pie Mi in O*(T) can be performed by calculating the rank R1=RankZ(P1, oSort*(T)) of the first character Z of this group and by calculating the position P1new of the corresponding character in O*(T) with P1new=SelectZ(R1, O*(T)) and by calculating the positions P2new, ..., Pmnew with P2new=SelectZ(R1+1, O*(T)), ..., Pmnew=SelectZ(R1+m−1, O*(T)). The searched set M2 finally contains the Positions P1new, ... Pmnew.

In order to build join pairs of identical words, we build all pairs of words W1, W2, where W1 and W2 belong to the same class.

The method to classify words and to find all join pairs of words by forward search in O(T) or in B(O(T)) and R(O(T)) or in B(O(T)) and W(R(O(T))) or by backward search in B(O*(T)) and R(O*(T)) or in B(O*(T)) and W(R(O*(T))) works similarly.

3.12. Sorted Classifications of Words and Searching all Join Pairs Via Forward Search The mapping of words to classes starts in this classification method at the word delimiters in oSort(T) or oSort*(T) respectively. Thus, the words are read, beginning at the end of the words for O(T), or beginning at the beginning of the words for O*(T)—the result and the method is identical for both cases. We describe the approach using O*(T), because without extra effort, the classes are sorted correctly only for O*(T).

The sorted classification algorithm generates a classification of each of the N word delimiters in oSort*(T) within a vector V having log(N) bits of memory per character of the string T as follows.

The sorted classification algorithm is a backtracking algorithm that starts with the set M of that positions P1, ..., Pn for which oSort*(T) contains a word delimiter, i.e., all positions P1, ..., Pn with oSort*(T)[Pi]=$, for i=1, ..., n.

```
N= | O*(T) |;
V = new Vector[1..N] ;
M = { Pi | oSort*(T)[Pi] ='$' }
SortClassify( M ) ;
```

Within each step of SortClassify(M), the set M of positions P1, ..., Pn is split according to the characters read in O*(T)[P1], ..., O*(T)[Pn] into k disjoint subsets M1, ..., Mk, where k is the number of different characters Z1, ..., Zk found in O*(T)[P1], ..., O*(T)[Pn]. These subsets Mi are sorted according to the characters Z1, ..., Zk that they represent, where the set M1 represents the word delimiter, if at least one set represents the word delimiter.

If Zi is not a word delimiter and the set Mi contains more than 1 element, the sorted classification is continued with each character that follows the current character within a current word, in order to check whether the positions in Mi belong to the same or to different words. So, the set Mnew of the successor positions Pi' of all positions Pi in Mi is determined as described below, and the classification of Mnew is continued recursively. Furthermore, the assignment of characters to words is transferred from the positions Pi to the positions Pi' in the Vector V.

If otherwise M1 represents the word delimiter or the currently processed set Mi is a singleton set, a new, consecutive class ID CID is generated and, for all word delimiters that belong to positions in Mi, it is stored in V that they belong to the class CID. As the class IDs are generated in alphabetical order, the vector V contains at the positions
Select$(1, oSort*(T)), ..., Select$(Rank$(|oSort*(T)|, oSort*(T)), oSort*(T)) which represent the beginnings of words, the mapping of the word delimiters to their class IDs in alphabetically increasing order.

```
SortClassify( M )
{ M1...Mk = split( M ) ; // group positions pi in M according to the
corresponding
        // character O*(T)[Pi], such that positions Pi with the same
        // character O*(T)[Pi] belong to the same subset Mj.
        // Furthermore, sort subsets alphabetically according to the
        // character they represent.
        // If one of these characters is '$', use M1 for representing this
        // character, i.e. for all p∈ M1: O*(T)[p] = '$'.
    For( i=1 .. k ) {
        if ( character represented by Mi is '$' or Mi is a singleton set ) {
            CID = Generate new class ID ;
            For each p∈ Mi // transfer word assignments to the word
            beginning
                V[Select$(V[p], oSort*(T))]=CID;
        }
        else { Mnew = Search following position of positions Mi in O*(T);
            For each pair of positions p∈ Mi and following positions
            p'∈ Mnew
                V[p'] = V[p]; // copy mapping of characters to words
            SortClassify ( Mnew ) ;
        }
    }
}
```

Let Z be the character in O*(T) that occurs at the positions P1, ..., Pm stored in Mi, i.e., Z=O*(T)[Pi] for all Pi∈Mi. The search in O*(T) for the positions Pinew following the positions Pi∈Mi in T can be done as follows. We calculate the rank R1=RankZ(P1, O*(T)) of the first character in O*(T) represented by Mi, and we calculate the position P1new of the corresponding following character in O*(T) via P1new=SelectZ(R1, oSort*T). Similarly, we calculate the new positions P2new, ..., Pmnew via P2new=SelectZ(R1+1, oSort*(T)), ..., Pmnew=SelectZ(R1+m−1, oSort*(T)). The searched set Mnew contains the positions P1new, ..., Pmnew.

By this way of grouping, the alphabetically smaller words are classified earlier as the alphabetically greater ones. Therefore, the alphabetically smaller words get the smaller class IDs. Thus, we can determine the sort order by means of checking the class ID assigned to the word delimiter.

The set of all join pairs of words is the set of all pairs (W1, W2) of words with W1 and W2 belonging to the same class.

Furthermore, we can not only build all join pairs W1=W2 of words W1 and W2 by building all pairs of words with identical classes, but also all join pairs W1<W2 of words by regarding all pairs of words W1, W2 where W1 has a smaller class ID than W2. Thus, we support theta joins, as the sorted classification represents a more compact storage of all theta join results.

The method for calculating a sorted classification of words to find all join pairs of words by forward search in B(O*(T)) and R(O*(T)) or in B(O*(T)) and W(R(O*(T))) works accordingly.

3.13. Searching any Given Substring t in O(T) Even Beyond Word Delimiters

Any substring t of T, even beyond word delimiters, can be searched and found directly in O(T) without full decompression of O(T) as follows.

In order to find any substring t of T that may contain word delimiters, we first search in O(T) for the substring of the first word in t.

For this purpose, we calculate with P=Select$(1, oSort(T)) the position P of the first word delimiter in oSort(T) and with R=Rank$(size(oSort(T)),oSort(T)) the number R of word delimiters in oSort(T). Based on this, we determine the positions P, ..., P+R-words(t) in O(T) to be the set of potential end of word positions of the first word of t, where words(t) is the number of words in t. Starting at these positions, we search backward the characters of the first word of t, until either all characters of the first word of t were found, or the characters of t do not correspond with the reconstructed character. Only if all characters of the currently searched word of t are found, we continue the search with the next word of t. In order to continue the search with the next word of t, we have to remember the position P of the current word delimiter in oSort(T). The next word is reconstructed from O(T) by starting with the character at the position P+1 in O(T).

Only if we have found the last word delimiter of t in oSort(T) and we search the characters that follow in t, we have to consider the following. If the last word of t has a length of X characters, only the first X characters of the last word reconstructed from O(T) have to correspond with the characters of the last word of t.

Algorithm: Search in O(T) for all start positions of substrings t, that contain at least one word delimiter

```
P1 = Select$(1,oSort(T)) ;
R = Rank$(size(oSort(T)),oSort(T)) ;
LastP = P1+R-words(t) ;
for ( P=P1 .. LastP ){
    S = 1st word of t is suffix of P-th word in T and starts at Position S
    in O(T) ;
        Matches[ P ] = S ; // S==0 if 1st word of t is not a suffix of P-th
        word in T
        for (w = 2 ; Matches[P] > 0 and w < words(t) ; w++ ) {
            if (Matches[ P ] > 0 and w-th word of t is not equal to
            P+w−1-th word in T)
                Matches[ P ] = 0 ;
        }
        if (Matches[ P ] > 0 and last word of t is not prefix of P−1+words(t)-th
        word in T)
            Matches[ P ] = 0 ;
}
```

The positions stored in Matches[P], ..., Matches[LastP] that differ from 0 are those positions in O(T) where a string starts that is equal to t.

As described above, the search of any continuous substring t, even beyond word delimiters, can be performed in a string O(T) without total decompression.

3.14. Determining the Position T at which a Given Substring t of T Starts

In order to be able to determine the start position of substrings t in T or in order to search substrings t that start in T at a given position in T, we initially once decompress O(T) into T and construct a bit index BI(T) for the search of the word delimiters of T. The bottom level of this index is a sequence of bits with a 1-bit for each word delimiter and a 0-bit for each other character of T.

If not the positions in O(T), but instead the positions in T are searched, where a substring starts that is equal to t, the algorithm given in the previous section has to be modified or extended as follows:

In order to determine for a given searched substring t of T the start position S in T (instead of determining the start position in O(T)), we start—similar to the algorithm given above—with searching for the first word of t. Let P be the position in oSort(T) of the word delimiter at the end of that word, the suffix of which is equal to the first word of t. Then, N=Rank$(P, oSort(T)) is the number N of the word of T that contains the first word of t within the words of T. Via the constructed bit index BI(T), we calculate P2=Select1(N, BI(T)), which is the position P2 of the Nth word delimiter in T. Then, we calculate S by subtracting the number of characters of the first word of t from P2.

Thus, we find the start position S of the searched substring t. This method works as well if the searched substring t does not contain any word delimiter, but in order to get the start position S of t in T, we have to read until the end of that word in T that contains t, in order to be able to read the position of the word delimiter from the index BI(T) and to calculate S.

3.15. Searching in O(T) for any Substring of T of Given Length that Starts at any Position in T and Even Contains Word Delimiters In order to reconstruct a substring t of length L that starts at position P in T, we do the following. We reconstruct from O(T) the smallest sequence of words that covers T[P] . . . T[P+L−1]. Thereby, we first determine how many word delimiters occur in T in positions being smaller than P+L−1. This is calculated via W2=Rank1(P+L−2, BI(T)). Then, we use W2 to calculate the end position of the minimal covering word sequence of t in T or to localize it in O(T) respectively. This end position in O(T) is calculated via Select$(W2+1, oSort(T)). Then, we can start the reconstruction of the word sequence that covers t in O(T) at position Select$(W2+1, oSort(T)), and we continue reconstructing the substring t backwards word by word, until we have read enough characters from O(T).

3.16. Deleting any Substring in O(T) that May go Beyond Word Delimiters

Figure 8:
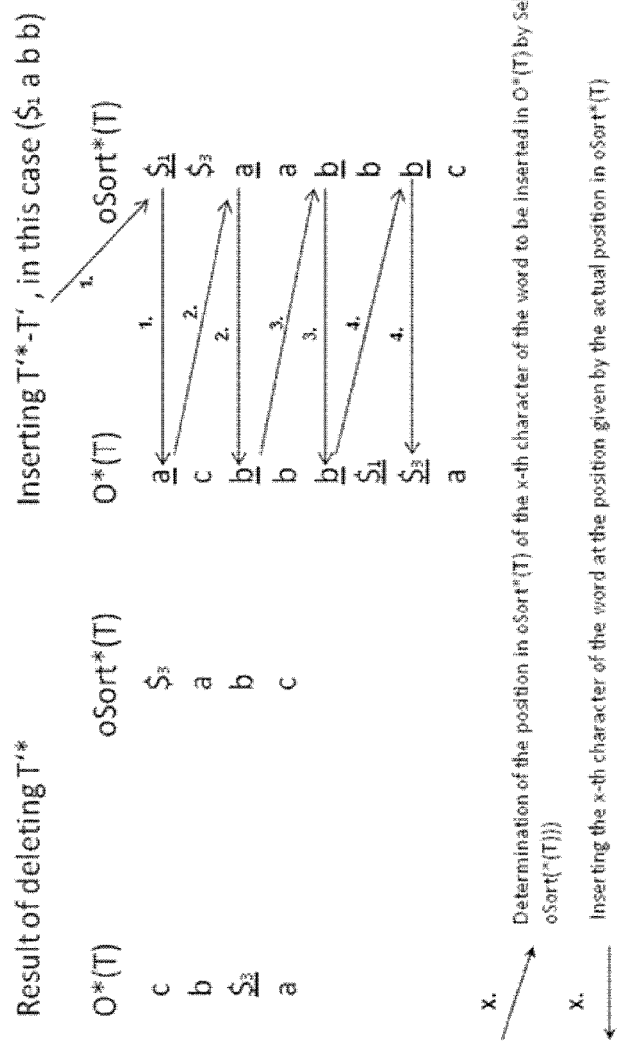
FIG. 8 shows a table to illustrate the deletion of the substring T.

Any given substring t of T that may even contain word delimiters can be searched and found in O(T) as described above. In order to delete the substring t from O(T), we delete the smallest sequence of words of T that completely covers t (c.f. FIG. 8). Furthermore, for O(T), we delete the word delimiter at the end of these words. (For O*(T), instead, we delete the word delimiter at the beginning of these words.). The search for this sequence of words is performed in the same way as the search for t. The deleted sequence of words consists of a prefix (that might be empty), followed by t, followed by a suffix (that might be empty). After having deleted this sequence of words covering t, we concatenate the prefix and the suffix to a string that is inserted at that position P in O(T) where the first end of word of the string that covers t was stored before the deletion.

Thus, we can delete any string in O(T) without a total decompression.

3.17. Inserting any Substring in O(T) that Even May Contain Word Delimiters at a Given Insertion Position We describe how to simulate on O(T) that any string t, which even may contain word delimiters, is inserted at any given position in T. The insertion position can be searched and found—as described above—directly in O(T) without decompressing O(T) to T. Thereafter, we split the word that surrounds the insertion position into a prefix that occurs in T before the insertion position and a suffix that occurs in T after the insertion position and delete that word from O(T). Afterwards, we insert a string consisting of prefix, t, and suffix at that position in O(T) where the last character of the deleted word was.

The insertion of a string consisting of N words at a position P in O(T) is done by inserting the N words sequentially starting at the positions P, . . . , P+N−1.

Thus, we can insert any string t at any position in O(T) without a total decompression of O(T).

3.18. Updating any Substring in O(T) that Even May Contain Word Delimiters

The replacement of any given substring t by any substring t_new in T can be simulated on O(T) by deleting the substring t from O(T) followed by inserting the substring t_new at the position, where the substring t has been deleted from O(T).

3.19. Searching any Substring in B(O(T)) and R(O(T)) or in B(O(T)) and W(R(O(T))) that Even May Contain Word Delimiters Any given substring t of T that even may contain word delimiters can be searched and found directly in B(O(T)) and R(O(T)). Searching a substring in B(O(T)) and R(O(T)) is performed similarly to searching in B(BWT(T)) and R(BWT(T)) with the following significant difference: If we reach a bit in B(O(T)) that represents an end of word (i.e., if the next character found during the search in O(T) will be the word delimiter) during the search in B(O(T)), the next end of word is represented by the next bit in B(O(T)) until we reach the last bit in B(O(T)) that represents an end of word. In B(O(T)) all bits that represent an end of word follow each other directly, and in R(O(T)) the characters that represent an end of word follow each other directly.

Thus, we can continue the search until the string t is reconstructed completely or until it is obvious that the string t cannot be reconstructed as the characters of t do not correspond with the characters reconstructed from B(O(T)) and R(O(T)) or as there do not exist any more bits in B(O(T)) that represent an end of word.

Thus, searching a given string t can be performed in B(O(T)) and R(O(T)) without a complete decompression.

Any substring t of T that even may contain word delimiters can be found and searched directly in B(O(T)) and W(R(O(T))). Searching a substring in B(O(T)) and W(R(O(T))) is similar to searching in B(BWT(T)) and W(R(BWT(T)))—again with the following significant difference:

Whenever the search in B(O(T)) reads a bit that represents an end of word, we can check the following bit, whether it represents an end of word as well. The characters that represent an end of word within the WT follow each other in the WT in the following sense. The first bits of the encoding of these characters follow each other within the root node of the WT.

Thus, this search for given strings can be performed in B(O(T)) and W(R(O(T))) without a total decompression.

3.20. Deleting any Substring that May Contain Word Delimiters in B(O(T)) and R(O(T)) or in B(O(T)) and W(R(O(T)))

Any substring t of T that may even contain word delimiters can be searched and found directly in B(O(T)) and R(O(T)) or in B(O(T)) and W(R(O(T))) as described above. In order to delete the string t from B(O(T)) and R(O(T)) or from B(O(T)) and W(R(O(T))), we delete the smallest sequence of words from T that completely covers t. The search of this sequence of words can be done in the same way as the search for t. The sequence of words to be deleted consists of a prefix (that might be empty), followed by t, followed by a suffix (that might be empty)—plus a word delimiter that is, depending on the search direction supported, either at the beginning or at the end of the string. After deleting the sequence of words covering t, we concatenate prefix, suffix, and a word delimiter to a string. This string is inserted as a new word at that position in B(O(T)) and R(O(T)) or in B(O(T)) and W(R(O(T))) that represents the first end of word of the deleted string that covers t.

Thus, we can delete any given string t from B(O(T)) and R(O(T)) or from B(O(T)) and W(R(O(T))) without total decompression.

3.21. Inserting any String that May Even Contain Word Delimiters in B(O(T)) and R(O(T)) or in B(O(T)) and W(R(O(T)))

We describe how to simulate on B(O(T)) and R(O(T)) or on B(O(T)) and W(R(O(T))) the insertion of any string t2 that may even contain word delimiters at any position in T that is identified by a given substring t.

The insertion position can be searched and found directly in B(O(T)) and R(O(T)) or in B(O(T)) and W(R(O(T))) as described above. First, the word that contains this insertion position is split into a prefix before the insertion position and a suffix behind the insertion position, and the word is deleted from B(O(T)) and R(O(T)) or from B(O(T)) and W(R(O(T))). Afterwards, we insert the string consisting of prefix, t2, and suffix at that position in B(O(T)) and R(O(T)) or in B(O(T)) and W(R(O(T))) where the word has been deleted. A string of N words W1, . . . , WN is inserted at a position P by inserting the words W1, . . . , WN word by word starting at the positions P, P, . . . , P+N−1.

3.22. Updating any Substring that May Even Contain Word Delimiters in B(O(T)) and R(O(T)) or in B(O(T)) and W(R(O(T)))

We can simulate the replacement of any substring t of T with a substring t_new by deleting t from T followed by inserting t_new at the position where t was deleted. Furthermore, we can simulate that any substring of any given length and at any given position in B(O(T)) and R(O(T)) or at any given position in B(O(T)) and W(R(O(T))) is replaced with a string t_new by a deletion followed by an insertion.

3.23. Generalization to Other Word Delimiters and Non-Textual Data

Instead of the word delimiter, any character occurring in T can be used for interrupting the standard BWT order. That is, we do not have to choose a blank, a space or any other whitespace character for indexing words or substrings of T, but we can choose any character of the string T, e.g., we can take any letter for indexing T. The chosen substring delimiter X splits the string T into substrings U1, . . . , Un, each of which ends with the substring delimiter X. We can access any substring in O(T) or in B(O(T)) and R(O(T)) or in B(O(T)) and W(R(O(T))) via the position of the corresponding substring delimiter X in oSort(T), and we can delete or insert any continuous substring in T without a total decompression.

This is useful to compress other data than texts, as e.g. pictures, multimedia data, etc., and to locally change the transformed or compressed data without a total decompression.

For the insert and delete operations, the average execution time of the needed operations depends on the average length of the substrings that have to be inserted or from which is deleted. The longer these substrings are, the higher is the execution time.

Furthermore, the compression ratio depends on the uniform distribution of the chosen substring delimiter within its context. If the context of this character does not appear uniformly distributed, we expect the compression ratio to get worse than when using BWT. This is a reason for choosing a word delimiter that is nearly independent of its context, i.e., for texts the blank is preferred.

3.24. Some Advantageous Properties of the Present Invention

According to the present invention, it is possible to determine the beginning and/or the end of a word, e.g. "cab", occurring in a string T directly within the permuted string O*(T). Thereby, it is possible to change, to delete or to insert words in O*(T) that occur at a given position in T. It is furthermore possible to sort the words in such a way, that the word order can be stored space efficiently within an extra data structure. By using the run length encoding (RLE) and/or a wavelet tree coding (WTC), the memory consumption can be reduced further.

An additional string oSort*(T), as shown in FIG. 1b, is calculated from the compressed string O*(T), i.e., the string oSort*(T) needs not to be stored, but can alternatively be calculated temporarily for each operation on T that is simulated by an operation on O*(T), as e.g. a deletion of the Nth word of T or an insertion of a new word into T. The string oSort*(T) contains a sorted sequence of the characters, where the delimiters '$_1$', '$_2$', '$_3$' . . . , that for example represent a space character, are at the beginning of the sorted sequence. Thus, they represent an index of the beginnings of the words, e.g. the first word delimiter character, '$_1$', of the string oSort*(T) corresponds to the first character 'a' of the first word "abc", and this character 'a' occurs at position 1 within O*(T), as can be seen in FIG. 2. At the second position of the string oSort*(T), there is the second word delimiter character, '$_2$' that corresponds to the first character 'c' of the second word "cab" of the string T, and the first character "c" of the second word occurs on the second position of the string O*(T).

As shown in FIG. 2, in order to search the second word "cab" of the string T within the compressed string O*(T), we calculate the string oSort*(T) and map its characters character by character to the string O*(T). The string oSort*(T) is being used for calculating the position of certain characters that occur in O*(T). Hereby, the Nth position of the string oSort*(T) is mapped to the Nth position of the string O*(T). After having determined the first character 'c' of the second word "cab" by mapping the symbol '$_2$' of oSort*(T) to the second position of the string O*(T) where the character 'c' occurs, we determine, at which position this character 'c' occurs within the string O*(T). In the present example, it is the first occurrence of a character 'c' in O*(T), i.e., it occurs before the next character 'c' at position 3 and before the third character 'c' at position 7 in O*(T). Now, we go to the first character 'c' within the sorted string oSort*(T). This first 'c' occurs at position 10 within oSort*(T). The second character 'a' of the second word "cab" can then be determined at position 10 within the string O*(T). It is the second character 'a' within O*(T), thus we continue with the second character 'a' within the string oSort*(T). This second 'a' occurs at position 5 within the string oSort*(T), such that the third character of the second word is determined to be at position 5 within the string O*(T). At this position, the character 'b' is read. As this character 'b' is the second character 'b' within the string O*(T), we continue with the corresponding character within the string oSort*(T). This is the second character 'b' within oSort*(T) which occurs at position 8 within oSort*(T). At position 8 within O*(T), the word delimiter '$_3$' occurs, thus the second word of T has been completely reconstructed and can be e.g. displayed or deleted from O*(T). The advantage of the present invention is that the second word of T has been completely reconstructed and can be deleted or displayed without decompressing other parts of O*(T)

The examples discussed above refer to the words within strings. Alternatively, instead of referring to words, the present invention can refer to any substring or data elements that represent a given content. For example, the data elements can represent substrings in pictures or in any data.

According to an application of the present invention, characters or parts of different substrings that occur in encoded form within the permuted string O(T), O*(T) can, for example, be decompressed.

For example, multiple parts of multiple words can be determined, updated or deleted, where the decompressed subset of T can include word delimiters. Especially characters or substrings occurring in a certain location of T can be decompressed or updated locally, i.e. without decompressing parts of T outside of that location. For example, within the bit sequence that represents a section of a picture, all symbols that represent the degree of the pixels' red color (subset M) can be updated, such that the degree of the pixels' red color of the section of the picture can be modified. This can be performed without having to decompress all other sections of the picture.

Additionally, instead of word delimiters, any character of any string or file T can be used as identification symbol for indexing the content of the string or file T. As we can access the Nth identification symbol directly via oSort(T), oSort*(T), we can, similar as for words, search, delete or modify the Nth substring of T directly in O(T), O*(T), without any need to decompress the other substrings of T.

According to a further application of the present invention, the permuted string O(T), O*(T) can, for example, be partitioned. As a partitioning criterion, we can for example distinguish between lower and upper case words. The upper case words can be assigned to a first permuted partition O(T1), O*(T1) of the permuted string O(T), O*(T), and the lower case words can be assigned to a second permuted partition O(T2), O*(T2) of the permuted string O(T), O*(T), without having to compress or permute these partitions (O(T1) and O(T2)), (O*(T1) and O*(T2)) again.

As only a selected part of the permuted strings O(T), O*(T) is decompressed, the decompression of the other—non-selected—parts of the permuted strings O(T), O*(T)—that in general are bigger—can be avoided.

4. Literature

[1] Burrows, M. and Wheeler, D. 1994. A block sorting lossless data compression algorithm, Technical Report 124, Digital Equipment Corporation.

[2] Roberto Grossi, Ankur Gupta, Jeffrey Scott Vitter: High-order entropy-compressed text indexes. SODA 2003: 841-850

[3] Gonzalo Navarro, Veli Makinen: Compressed full-text indexes. ACM Comput. Surv. 39(1): (2007)

[4] D. Arroyuelo, F. Claude, S. Maneth, V. Makinen, G. Navarro, K. Nguyen, J. Siren, N. Valimaki: Fast In-Memory XPath Search using Compressed Indexes. Accepted to ICDE 2010.

5. Some Selected Properties of the Present Invention 5.1. Construction of O(T) or O*(T)

The present invention comprises a method to construct a permuted string O(T) or O*(T) from a given string T, such that 1. The string T is permuted in a revertible way, where the permutation is sorted according to a given sorting criterion.

2. The sorting criterion is chosen in such a way that special characters of T (e.g. the word delimiters) are positioned within the sorted permuted string oSort(T) or oSort*(T) in such a way, that from the order of these special characters in oSort(T) or oSort*(T), the order of these special characters in T can be calculated without accessing the other characters of O(T) or O*(T), and the other way round, that from the order of these special characters in T, the order of these special characters in oSort(T) or oSort*(T) can be calculated without accessing the other characters of O(T) or O*(T).

5.2. Searching the Nth Word

Based on section 5.1, the present invention comprises a method to use the sorting order of the special characters in oSort(T) or oSort*(T) to access the Nth word of T directly in O(T) or in O*(T)—without having to decompress O(T) or O*(T) and without any need of additional pointers to the words.

5.3. Deleting the Nth Word

Based on sections 5.1 and 5.2, the present invention comprises a method to delete the Nth word of T from O(T) or from O*(T)—without having to decompress or recompress O(T) or O*(T).

5.4. Inserting the Nth Word

Based on sections 5.1 and 5.2, the present invention comprises a method to insert a new word as the Nth word of a string T into the permuted string O(T) or O*(T)—without having to decompress or recompress O(T) or O*(T).

5.5. Updating the Nth Word

Based on sections 5.1 and 5.2, the present invention comprises a method to update the Nth word of T by updates of the permuted structure O(T) or O*(T)—without having to decompress or recompress O(T) or O*(T).

5.6. Searching all Words in O(T) or in O*(T) that are <, <=, >, >=, = or Unequal to a Given String Based on section 5.1, the present invention comprises a method to use the sorting order of the special characters in oSort(T) or oSort*(T) to directly determine in O(T) or in O*(T) for any given string the position in T or in O(T) or O*(T) of those words that are <, <=, >, >=, = or unequal to the given string—without having to decompress O(T) or O*(T) completely and without any need of additional pointers to the words.

5.7. Searching all Pairs of Words in O(T) or in O*(T) that are Equal or Unequal to Each Other Based on section 5.1, the present invention comprises a method to use the sorting order of the special characters in oSort(T) or in oSort*(T) to directly determine in O(T) or in O*(T) the positions of pairs of words of T, such that the words are equal or unequal to each other—without having to decompress O(T) or O*(T) completely and without any need of additional pointers to the words.

5.8. Sorting Classification of Words in O(T) or in O*(T)

Based on section 5.1, the present invention comprises a method to use the sorting order of the special characters in oSort*(T) to directly classify in O*(T) all words according to a sorting criterion (<, <=, =, unequal, >=, >) and to determine all pairs of words that fulfill the given sorting criterion— without having to decompress O(T) or O*(T) completely back into T and without any need of additional pointers to the words.

5.9. Determining the Start Position in T or in O(T) or in O*(T) of any Given Substring T Based on section 5.1, the present invention comprises a method to use the sorting order of the special characters in oSort(T) or in oSort*(T) to directly determine the position of any given substring in T or in O(T) or in O*(T)—without having to decompress O(T) or O*(T) completely and without any need of additional pointers to the words encoded in O(T), O*(T).

5.10. Searching any Substring that Starts at a Given Position of the String T or at a Given Position of the Permuted String O(T) or O*(T)

Based on section 5.1, the present invention comprises a method to use the sorting order of the special characters in oSort(T) or oSort*(T) to directly search any substring in O(T) or in O*(T) that starts at a given position of the string T or at a given position of the string O(T) or O*(T)—without having to decompress O(T) or O*(T) completely and without any need of additional pointers to the words encoded in O(T),O*(T).

5.11. Inserting, Deleting or Updating any Substring that Starts at a Given Position of the String T or at a Given Position of the Permuted String O(T) or O*(T)

Based on sections 5.1-5.5 and 5.10, the present invention comprises a method to use the sorting order of the special characters in oSort(T) or oSort*(T) to directly insert, delete or update a substring within O(T) or within O*(T), where the substring starts at a given position of the string T or at a given position of the permuted string O(T) or O*(T)—without having to decompress O(T) or O*(T) completely and without any need of additional pointers to the words encoded in O(T),O*(T).

5.12. Partitioning of O(T) or O*(T) without Decompression

Based on sections 5.1 and 5.3, the present invention comprises a method to use the sorting order of the special characters in oSort(T) or oSort*(T) in order to partition O(T) or O*(T) into disjoint permuted substrings O(T1), ..., O(Tn) or into disjoint permuted substring O*(T1), ..., O*(Tn)—without having to decompress O(T) or O*(T) completely and without having to compress O(T1), O(T2), O*(T1) or O*(T2), and without any need of additional pointers to the words.

5.13. Transferring the Calculation of O(T) or O*(T) to the Run Length Encoding and to the Wavelet Tree Coding Based on sections 5.1 to 5.12, the present invention comprises methods for using the sorting order of the special characters in oSort(T) or oSort*(T) to calculate each of the following data formats:

B(O(T)) and R(O(T)) or B(O(T)) and W(R(O(T))) or B(O*(T)) and R(O*(T)) or B(O*(T)) and W(R(O*(T))).

5.14. Transferring all Methods to Run Length Encoding and to the Wavelet Tree Coding Based on sections 5.1 to 5.13, the present invention comprises a set of methods, one method corresponding to each of the subsections 5.1. to 5.13, for using the sorting order of the special characters in oSort(T) or in oSort*(T) in order to perform the methods specified in sections 5.2-5.12 directly on B(O(T)) and R(O(T)) or directly on B(O(T)) and W(R(O(T))) or directly on B(O*(T)) and R(O*(T)) or directly on B(O*(T)) and W(R(O*(T))).

5.15. Optimizing the Run Length Encoding while Inserting or Deleting

Based on sections 5.1, 5.3 and 5.4, the present invention comprises a method to optimize the run length encoding in B(O(T)) or in B(O*(T)) when deleting or inserting into B(O(T)) and R(O(T)) or into B(O(T)) and W(R(O(T))) or into B(O*(T)) and R(O*(T)) or into B(O*(T)) and W(R(O*(T))).

5.16. Application on Arbitrary Strings

Based on the sections 5.1 to 5.15, the present invention comprises a set of methods, one method corresponding to each of the subsections 5.1. to 5.15, to process an arbitrary string (T) and to use an arbitrary identification symbol (e.g. $) that occurs in T, such that the methods comprise searching, inserting, deleting and updating arbitrary continuous or non-continuous substring locally on O(T), O*(T) without having to extract or to decompress the other substrings of T from O(T), O*(T), and the methods comprise classification, sorting and partitioning of the permuted strings O(T), O*(T) without having to decompress the permuted string into the string T.

The present invention is not limited to embodiments described herein; reference should be had to the appended claims.

What is claimed is:

1. A method to at least one of compress and decompress data in a device, the method comprising:
providing the device;
providing a string (T) consisting of multiple given substrings to the device;
assigning identification symbols ($,$_1$,$_2$,$_3$) to the substrings of the string (T) in the device;
transferring the substrings of the string (T) by permutation into a permuted string (O(T),O*(T)) in the device;
sorting the permuted string (O(T),O*(T)) into a sorted permuted string (oSort(T), oSort*(T)) according to a given sorting criterion in the device; and
at least one of decompressing, deleting and changing a portion of the string (T) within the permuted string (O(T),O*(T)) for an arbitrary substring of the string (T) within the permuted string (O(T),O*(T)) in the device, wherein,
the identification symbols ($,$_1$,$_2$,$_3$) are permuted and sorted together with the substrings of the sting (T) so that, in a partial inverse transformation step, characters of an Nth substring are sequentially determined within the permuted string (O(T),O*(T)) after determining a position (P) of an Nth identification symbol ($,$_1$,$_2$,$_3$) assigned to an Nth substring within the sorted permuted string (oSort(T),oSort*(T)) without reading characters of other substrings of the permuted string (O(T),O*(T)).

2. The method as recited in claim 1, wherein the characters of the Nth sub string are sequentially determined with the permuted string (O(T),O*(T)) by at least one of mapping the characters of the Nth substring within the permuted string (O(T),O*(T)) to characters of the sorted permuted string (oSort(T),oSort*(T)) and mapping characters of the sorted permuted string (oSort(T),oSort*(T)) to the characters of the Nth substring within the permuted string (O(T),O*(T)) according to a given specification on how to determine positions.

3. The method as recited in claim 1, further comprising weighting the identification symbols ($,$_1$,$_2$,$_3$) during the sorting of the permuted string (O(T),O*(T)) in the device so as to provide an unambiguous and invertible sort function between a sequence of identification symbols ($,$_1$,$_2$,$_3$) within the sorted permuted string (oSort(T),oSort*(T)) and a sequence of the sorted permuted string (oSort(T),oSort*(T)) in the string (T).

4. The method as recited in claim 1, further comprising positioning the identification symbols ($,$_1$,$_2$,$_3$) both among the identification symbols ($,$_1$,$_2$,$_3$) and in relation to other characters of the string (T) in the sorted permuted string (oSort(T), oSort*(T)) in the device so as to provide an unambiguous and invertible function between a position (P) of a respective Nth identification symbol ($,$_1,$_2,$_3$) within the string (T) and a position (P) of the respective Nth identification symbol within the sorted permuted string (oSort(T),oSort*(T)).

5. The method as recited in claim 1, further comprising generating a run length encoding (B(O(T));(B(O*(T)); R(O(T));(R(O*(T))) from the permuted string (O(T), (O*(T)) in the device.

6. The method as recited in claim 1, further comprising generating a wavelet tree code (W(R (O(T))),(W(R(O* (T)))) from at least one of the permuted string (O(T),O* (T)) and a run length code (B(O(T)),B(O*(T)), (RO(T)), R(O*)T)))) of the permuted string (O(T),O*(T)) in the device.

7. The method as recited in claim 1, further comprising at least one of
searching a portion of the string (T) within the permuted string (O(T),O*(T)) for an arbitrary substring of the string (T) within the permuted string (O(T),O*(T)) in the device,
sorting a respective portion of the string (T) within the permuted string (O(T),O*(T)) in the device, and
inserting an additional string within the permuted string (O(T),O*(T)) at a position (P) of the respective portion of the string (T) in the device.

8. The method as recited in claim 7, wherein at least one of
only the Nth substring of the string (T) within the permuted string (O(T),O*(T)) or a portion of the Nth substring within permuted string (O(T),O*(T)) is at least one of decompressed, deleted, changed and searched for the arbitrary substring of the string (T) within the permuted string (O(T),O*(T)),
the substrings of the string (T) within the permuted string (O(T),O*(T)) are sorted, and
an additional substring is inserted into the permuted string (O(T),O*(T)).

9. The method as recited in claim 7, further comprising at least one of
at least one of decompressing, deleting and changing not all of the characters of string (T), but at least corresponding characters of substrings within the permuted string (O(T),O*(T)) that contain a subset (M), so as to search, change or delete an arbitrary given subset (M) of characters of string (T) in the device,
searching the string (T) for the substrings which contain characters of the subset (M) in the device, and
inserting additional characters at places corresponding to positions of characters of the subset (M) of the permuted string (O(T),O*(T)) in the device.

10. The method as recited in claim 1, further comprising at least one of
classifying substrings within the permuted string (O(T),O* (T)) by assigning different substrings or portions thereof to different classes in the device, and
partitioning the permuted string (O(T),O*(T)) into N permuted strings (O(T1), . . . , O(TN)),(O*(T1), . . . O*(TN)) so that substrings or portions thereof within the string (T) that conform to different partitioning criteria are assigned to different permuted strings (O(T1), . . . , O(TN)), (O*(T1), . . . , O*(TN)) in the device.

11. A device configured to execute a method to at least one of compress and decompress data, the method comprising:
providing a string (T) consisting of multiple given substrings;
assigning identification symbols ($,$_1,$_2,$_3$) to the substrings of the string (T);
transferring the substrings of the string (T) by permutation into a permuted string (O(T),O*(T));
sorting the permuted string (O(T),O*(T)) into a sorted permuted string (oSort(T), oSort*(T)) according to a given sorting criterion; and
at least one of decompressing, deleting and changing a portion of the string (T) within the permuted string (O(T),O*(T)) for an arbitrary substring of the string (T) within the permuted string (O(T),O*(T)),
wherein,
the identification symbols ($,$_1,$_2,$_3$) are permuted and sorted together with the substrings of the sting (T) so that, in a partial inverse transformation step, characters of an Nth substring are sequentially determined within the permuted string (O(T),O*(T)) after determining a position (P) of an Nth identification symbol ($,$_1,$_2,$_3$) assigned to an Nth substring within the sorted permuted string (oSort(T),oSort*(T)) without reading characters of other substrings of the permuted string (O(T),O*(T)).

12. A computer program comprising a program code stored on a non-transitory computer-readable storage medium configured to apply the method as recited in claim 1.

* * * * *